(12) United States Patent
Haba et al.

(10) Patent No.: US 12,191,233 B2
(45) Date of Patent: Jan. 7, 2025

(54) EMBEDDED COOLING SYSTEMS AND METHODS OF MANUFACTURING EMBEDDED COOLING SYSTEMS

(71) Applicant: Adeia Semiconductor Bonding Technologies Inc., San Jose, CA (US)

(72) Inventors: Belgacem Haba, Saratoga, CA (US); Thomas Workman, San Jose, CA (US); Cyprian Emeka Uzoh, San Jose, CA (US); Guilian Gao, Campbell, CA (US); Rajesh Katkar, Milpitas, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 259 days.

(21) Appl. No.: 17/876,376

(22) Filed: Jul. 28, 2022

(65) Prior Publication Data
US 2024/0038633 A1 Feb. 1, 2024

(51) Int. Cl.
*H01L 23/34* (2006.01)
*H01L 23/00* (2006.01)
(Continued)

(52) U.S. Cl.
CPC ............ *H01L 23/473* (2013.01); *H01L 23/32* (2013.01); *H01L 23/467* (2013.01); *H01L 24/05* (2013.01);
(Continued)

(58) Field of Classification Search
CPC ..... H01L 23/473; H01L 23/32; H01L 23/467; H01L 24/05; H01L 24/80; H01L 24/94;
(Continued)

(56) References Cited

U.S. PATENT DOCUMENTS 4,274,479 A 6/1981 Eastman
5,309,986 A 5/1994 Itoh
(Continued)

FOREIGN PATENT DOCUMENTS

CN 109524373 A 3/2019
CN 111128976 A 5/2020
(Continued)

OTHER PUBLICATIONS

Evan G. Colgan, "A Practical Implementation of Silicon Microchannel Coolers", available online at <https://www.electronics-cooling.com/2007/11/a-practical-implementation-of-silicon-microchannel-coolers/>, Nov. 1, 2007, 10 pages.
(Continued)

*Primary Examiner* — Niki H Nguyen
(74) *Attorney, Agent, or Firm* — HALEY GUILIANO LLP

(57) ABSTRACT

Embodiments herein provide for fluidic cooling assemblies embedded within a device package and related manufacturing methods. In one embodiment, the cooling assembly includes a cold plate body attached to a singulated device and a manifold lid attached to the cold plate body. The cold plate body has a first side adjacent to the singulated device and an opposite second side, and the manifold lid is attached to the second side. In some embodiments, the first side of the cold plate body and the backside of the singulated device each comprise a dielectric material surface, the cold plate body is attached to the singulated device by direct dielectric bonds formed between the dielectric material surfaces, the cold plate body, and the manifold lid define one or more cavities, and the one or more cavities form at least a portion of a fluid flow path from an inlet to an outlet of the manifold lid.

30 Claims, 16 Drawing Sheets

(51) Int. Cl.
  *H01L 23/32* (2006.01)
  *H01L 23/467* (2006.01)
  *H01L 23/473* (2006.01)
  *H01L 25/065* (2023.01)
  *H01L 25/10* (2006.01)
  *H01L 25/18* (2023.01)

(52) U.S. Cl.
  CPC .............. *H01L 24/08* (2013.01); *H01L 24/80* (2013.01); *H01L 24/94* (2013.01); *H01L 25/0657* (2013.01); *H01L 25/105* (2013.01); *H01L 25/18* (2013.01); *H01L 24/16* (2013.01); *H01L 24/32* (2013.01); *H01L 24/73* (2013.01); *H01L 2224/05647* (2013.01); *H01L 2224/05686* (2013.01); *H01L 2224/05693* (2013.01); *H01L 2224/08245* (2013.01); *H01L 2224/16225* (2013.01); *H01L 2224/32225* (2013.01); *H01L 2224/73204* (2013.01); *H01L 2224/80486* (2013.01); *H01L 2224/80895* (2013.01); *H01L 2224/80896* (2013.01); *H01L 2224/94* (2013.01); *H01L 2225/06517* (2013.01); *H01L 2924/04642* (2013.01); *H01L 2924/0504* (2013.01); *H01L 2924/05432* (2013.01); *H01L 2924/0544* (2013.01); *H01L 2924/059* (2013.01)

(58) Field of Classification Search
  CPC .............. H01L 25/0657; H01L 25/105; H01L 25/18; H01L 24/16; H01L 24/73; H01L 2224/05647; H01L 2224/08245; H01L 2224/16225; H01L 2224/73204; H01L 2224/32225; H01L 2224/80486; H01L 2224/80895; H01L 2224/80896; H01L 2224/94; H01L 2225/06517; H01L 2924/04642; H01L 2924/0504; H01L 2924/05432; H01L 2924/0544; H01L 2924/059; H01L 23/3672; H01L 23/427; H01L 23/3677; H01L 21/4871; H01L 31/0521; H01L 2224/16145; H01L 25/0655; H01L 2023/4056; H01L 2023/4043; H01L 21/4882; H01L 31/024
  See application file for complete search history.

(56) References Cited

U.S. PATENT DOCUMENTS

| | | | |
|---|---|---|---|
| 5,522,452 A | 6/1996 | Mizuno et al. | |
| 5,769,154 A | 6/1998 | Adkins et al. | |
| 6,056,044 A | 5/2000 | Benson et al. | |
| 6,351,384 B1 | 2/2002 | Daikoku et al. | |
| 6,686,532 B1 | 2/2004 | Macris | |
| 6,822,326 B2 | 11/2004 | Enquist et al. | |
| 7,289,326 B2 | 10/2007 | Heydari et al. | |
| 7,485,957 B2 | 2/2009 | Brandenburg et al. | |
| 7,511,372 B2 | 3/2009 | Chiu | |
| 7,523,617 B2 | 4/2009 | Venkatasubramanian et al. | |
| 7,622,324 B2 | 11/2009 | Enquist et al. | |
| 7,692,926 B2 | 4/2010 | Henderson et al. | |
| 7,957,137 B2 | 6/2011 | Prasher | |
| 7,978,473 B2 | 7/2011 | Campbell et al. | |
| 7,997,087 B2 | 8/2011 | Venkatasubramanian et al. | |
| 8,164,169 B2 | 4/2012 | Chrysler et al. | |
| 8,630,091 B2 | 1/2014 | Ward et al. | |
| 9,224,673 B2 | 12/2015 | Chen et al. | |
| 9,299,641 B2 | 3/2016 | Sekar et al. | |
| 9,355,932 B2 | 5/2016 | Ankireddi et al. | |
| 9,391,143 B2 | 7/2016 | Tong et al. | |
| 9,553,071 B1 | 1/2017 | Haba | |
| 9,741,638 B2 | 8/2017 | Hsieh et al. | |
| 9,741,696 B2 | 8/2017 | Katkar et al. | |
| 9,746,248 B2 | 8/2017 | Semenov et al. | |
| 9,768,149 B2 | 9/2017 | Vadhavkar et al. | |
| 9,818,723 B2 | 11/2017 | Haba | |
| 10,032,695 B2 | 7/2018 | Iyengar et al. | |
| 10,083,934 B2 | 9/2018 | Haba | |
| 10,157,818 B2 | 12/2018 | Chen et al. | |
| 10,170,392 B2 | 1/2019 | Chainer et al. | |
| 10,199,356 B2 | 2/2019 | Kinsley | |
| 10,312,221 B1 | 6/2019 | Agarwal et al. | |
| 10,332,823 B2 | 6/2019 | Chen et al. | |
| 10,461,059 B2 | 10/2019 | Koopmans et al. | |
| 10,694,641 B2 | 6/2020 | Basu et al. | |
| 10,978,427 B2 | 4/2021 | Li et al. | |
| 11,187,469 B2 | 11/2021 | Karesh | |
| 11,387,164 B2 | 7/2022 | Wu et al. | |
| 11,598,594 B2 | 3/2023 | Lewis et al. | |
| 11,996,351 B2 | 5/2024 | Hsiao et al. | |
| 2003/0157782 A1 | 8/2003 | Kellar et al. | |
| 2004/0184237 A1 | 9/2004 | Chang | |
| 2004/0251530 A1 | 12/2004 | Yamaji | |
| 2005/0126766 A1 | 6/2005 | Lee et al. | |
| 2005/0213301 A1 | 9/2005 | Prasher | |
| 2006/0042825 A1 | 3/2006 | Lu et al. | |
| 2006/0103011 A1* | 5/2006 | Andry ................. | H01L 25/0657 257/E23.098 |
| 2007/0025082 A1 | 2/2007 | Lee et al. | |
| 2007/0107875 A1 | 5/2007 | Lee et al. | |
| 2008/0096320 A1 | 4/2008 | Farrar | |
| 2009/0122491 A1 | 5/2009 | Martin et al. | |
| 2010/0116534 A1 | 5/2010 | Choi et al. | |
| 2010/0230805 A1 | 9/2010 | Refai-Ahmed | |
| 2010/0300202 A1 | 12/2010 | Joyce | |
| 2011/0129986 A1 | 6/2011 | Libralesso et al. | |
| 2013/0044431 A1 | 2/2013 | Koeneman | |
| 2013/0050944 A1* | 2/2013 | Shepard ................ | H01L 23/473 165/173 |
| 2013/0087904 A1 | 4/2013 | Clark et al. | |
| 2014/0126150 A1 | 5/2014 | Song et al. | |
| 2015/0194363 A1 | 7/2015 | Jun et al. | |
| 2016/0276314 A1 | 9/2016 | Ching et al. | |
| 2017/0012016 A1 | 1/2017 | Joshi et al. | |
| 2017/0092565 A1 | 3/2017 | Chen et al. | |
| 2017/0103937 A1 | 4/2017 | Hsieh et al. | |
| 2018/0053730 A1 | 2/2018 | Shao et al. | |
| 2018/0087842 A1 | 3/2018 | Chainer et al. | |
| 2018/0090427 A1 | 3/2018 | Bernstein et al. | |
| 2018/0160565 A1 | 6/2018 | Parida | |
| 2018/0211900 A1 | 7/2018 | Gutala et al. | |
| 2018/0308783 A1 | 10/2018 | Refai-Ahmed et al. | |
| 2019/0008071 A1 | 1/2019 | Kim | |
| 2019/0355706 A1 | 11/2019 | Enquist et al. | |
| 2019/0385928 A1 | 12/2019 | Leobandung | |
| 2020/0035583 A1 | 1/2020 | Beauchemin et al. | |
| 2020/0105639 A1 | 4/2020 | Valavala et al. | |
| 2020/0312742 A1 | 10/2020 | Lofgreen et al. | |
| 2020/0343160 A1 | 10/2020 | Mizerak et al. | |
| 2020/0350233 A1 | 11/2020 | Mizerak et al. | |
| 2020/0352053 A1 | 11/2020 | Mizerak et al. | |
| 2020/0395313 A1 | 12/2020 | Mallik et al. | |
| 2021/0066164 A1 | 3/2021 | Wu et al. | |
| 2021/0175143 A1 | 6/2021 | Yu et al. | |
| 2021/0183741 A1 | 6/2021 | Jha et al. | |
| 2021/0193548 A1 | 6/2021 | Wan et al. | |
| 2021/0193620 A1 | 6/2021 | Refai-Ahmed et al. | |
| 2021/0280497 A1 | 9/2021 | Brun et al. | |
| 2021/0288037 A1 | 9/2021 | Tao et al. | |
| 2021/0378106 A1 | 12/2021 | Iyengar et al. | |
| 2021/0378139 A1 | 12/2021 | Rice et al. | |
| 2021/0410329 A1 | 12/2021 | Yang et al. | |
| 2022/0037231 A1* | 2/2022 | Hsiao ................... | H01L 21/563 |
| 2022/0087059 A1 | 3/2022 | Sathyamurthy et al. | |
| 2022/0117115 A1 | 4/2022 | Malouin et al. | |
| 2022/0130734 A1 | 4/2022 | Chiu et al. | |
| 2022/0189850 A1 | 6/2022 | Liff et al. | |
| 2022/0210949 A1 | 6/2022 | Edmunds et al. | |
| 2022/0230937 A1 | 7/2022 | Malouin et al. | |
| 2022/0408592 A1 | 12/2022 | Malouin et al. | |
| 2023/0048500 A1 | 2/2023 | Malouin et al. | |
| 2023/0154828 A1 | 5/2023 | Haba et al. | |

(56) References Cited

U.S. PATENT DOCUMENTS

| | | |
|---|---|---|
| 2023/0156959 A1 | 5/2023 | Malouin et al. |
| 2023/0207474 A1 | 6/2023 | Uzoh et al. |
| 2023/0245950 A1 | 8/2023 | Haba et al. |
| 2023/0284421 A1 | 9/2023 | Malouin et al. |
| 2023/0298969 A1 | 9/2023 | Park et al. |
| 2024/0203823 A1 | 6/2024 | Uzoh et al. |
| 2024/0222222 A1 | 7/2024 | Haba et al. |
| 2024/0222226 A1 | 7/2024 | Haba |
| 2024/0249995 A1 | 7/2024 | Haba |
| 2024/0249998 A1 | 7/2024 | Gao et al. |
| 2024/0266255 A1 | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

IBM, "Functional electronic packaging—Thermal management roadmap", available online at <https://web.archive.org/web/20170220095511/https://www.zurich.ibm.com/st/electronicpackaging/cooling.html>, Feb. 20, 2017, 7 pages.

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

International Search Report and Written Opinion received for PCT Patent Application No. PCT/US23/85816, mailed on Apr. 23, 2024, 11 pages.

International Search Report and Written Opinion received for PCT Patent Application No. PCT/US23/86233, mailed on Apr. 26, 2024, 7 pages.

Kaplan, F. et al., "LoCool: Fighting Hot Spots Locally for System Energy Efficiency" IEEE Transactions on Computer-Aided Design of Intergrated Circuits and Systems, 39(4):895-908 (2020).

U.S. Appl. No. 18/129,567, filed Mar. 31, 2023, First Name Inventor: Cyprian Emeka Uzoh, "Embedded Cooling Systems for Device Packages and Methods of Cooling Packaged Devices".

PCT Application No. PCT/US2024/022253, International Search Report and Written Opinion dated Jul. 17, 2024, 14 pages.

Shamsa, M., et al., "Thermal conductivity of diamond-like carbon films", Applied Physics Letters, vol. 89, No. 16, Oct. 20, 2006, pp. 161921-161921-3.

Wu, C. J., et al., "Ultra High Power Cooling Solution for 3D-Ics", 2021 Symposium on VLSI Technology, Jun. 2021, 2 pages.

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.

"Microconvective Liquid Cooling for high power electronics," https://jetcool.com/technology/, downloaded Mar. 7, 2024, 6 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

International Search Report and Written Opinion mailed Jun. 5, 2024, in International Application No. PCT/US2024/013758, 9 pages.

International Search Report and Written Opinion mailed Mar. 16, 2023, in International Application No. PCT/US2022/050105, 9 pages.

International Search Report and Written Opinion mailed May 30, 2023, in International Application No. PCT/US2023/061494, 9 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

Lien, Y-J, et al., "An Energy-efficient Si-integrated Micro-cooler for High Power and Power-density Computing Applications," 74th Electronic Components and Technology Conference, 2024, pp. 1025-1029.

Walsh, Stephen Michael, "Microjet Impingement Cooling of High Power-Density Electronics," Thesis, submitted May 11, 2018, 93 pages.

\* cited by examiner

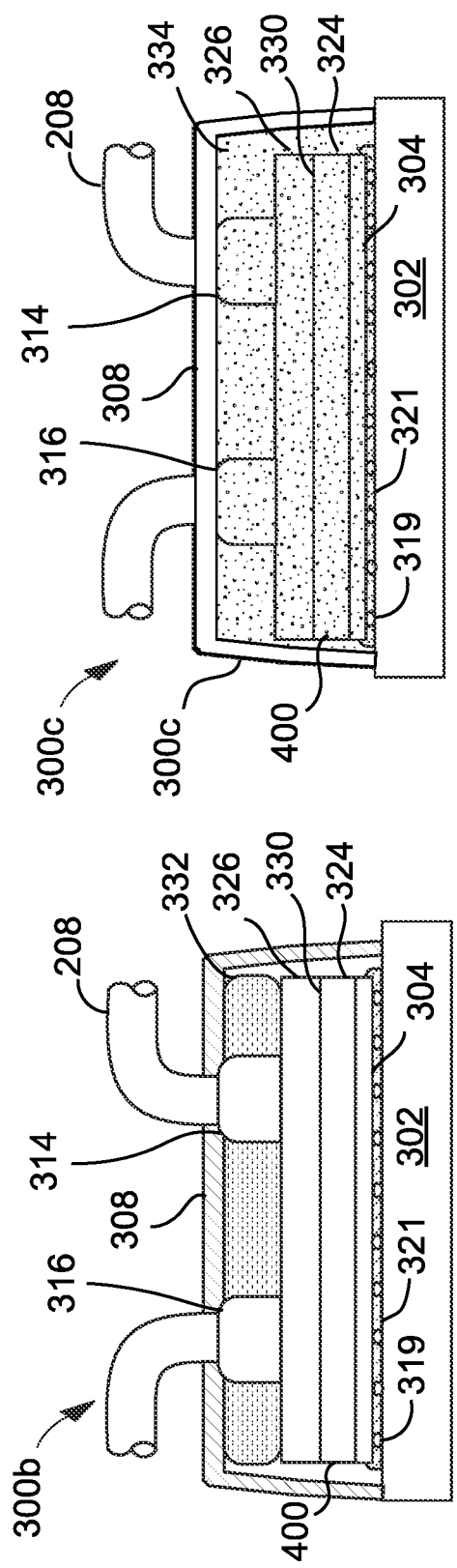

EMBEDDED COOLING SYSTEMS AND METHODS OF MANUFACTURING EMBEDDED COOLING SYSTEMS

FIELD

The present disclosure relates to advanced packaging for microelectronic devices, in particular, embedded cooling systems for semiconductor device packages and methods of manufacturing the same.

BACKGROUND

Energy consumption poses a critical challenge for the future of large-scale computing as the world's computing energy requirements are rising at a rate that most would consider unsustainable. Some models predict that the information and communications and technology (ICT) ecosystem could exceed 20% of global electricity use by 2030, with direct electrical consumption by large-scale computing centers accounting for more than one-third of that energy usage. Cooling costs make up a significant portion of computing center energy requirements as even small increases in operating temperatures can negatively impact the performance of microprocessors, memory devices, and other electronic components.

Thermal dissipation in high-power density chips is also a critical challenge as improvements in chip performance, e.g., through increased gate density and multi-core microprocessors, have resulted in increased power density and a corresponding increase in thermal flux that contributes to elevated chip temperatures. These elevated temperatures are undesirable as they can degrade the chip's operating performance, efficiency, and reliability. Cooling systems used to maintain the chip at a desired operating temperature typically remove heat using one or more heat dissipation devices, e.g., thermal spreaders, heat pipes, cold pipes, and heat sinks, which are thermally coupled to the chip using a compliant thermally conductive material (TIM), e.g., thermal pastes, thermal adhesives, thermal gap fillers, etc. The thermal interface material maintains thermal contact with the surfaces of the chip and heat dissipation device(s) to facilitate heat transfer therebetween. Unfortunately, the combined thermal resistance of thermal interface materials and the thermal resistance at interfacial boundary regions inhibits heat transfer from the chip to the heat dissipation devices, undesirably reducing the cooling efficiency of the cooling system.

Accordingly, there exists a need in the art for improved energy-efficient cooling systems and methods of manufacturing the same.

SUMMARY

One general aspect includes an embedded cooling assembly for a microelectronic device package. In one embodiment, the cooling assembly is directly attached to a singulated device. The singulated device generally includes an active side and an opposite backside. The cooling assembly may include (i) a cold plate body that includes a stack of one or more base plates, where one of the base plates is directly attached to the backside of the singulated device without an intervening adhesive, and (ii) a manifold lid attached to the cold plate body. In some embodiments, the cold plate body and the manifold lid define one or more cavities that form a flow path between an inlet opening and an outlet opening disposed through the manifold lid. In some embodiments, the cooling assembly is attached to the singulated device by direct dielectric bonds formed therebetween. In some embodiments, the cooling assembly is attached to the singulated device by a hybrid of direct dielectric and direct metal bonds.

Implementations of the cooling assembly may include one or more of the following features. The cooling assembly where the cold plate body is coextensive with the singulated device, such that the sidewalls of the cold plate body are substantially flush with the sidewalls of the singulated device. The cooling assembly where the side surfaces of the cold plate body are substantially perpendicular to the backside of the singulated device. The cooling assembly where the side surfaces of the manifold lid are substantially coplanar with the side surfaces of the cold plate body around a perimeter of the cooling assembly. The cooling assembly where the cold plate body includes an upper base plate and a lower base plate; the manifold lid and the upper base plate define a first cavity and a second cavity; the first cavity is separated from the second cavity, and; the lower base plate and the upper base plate define a third cavity. The cooling assembly where the third cavity is disposed in fluid communication with the first cavity and the second cavity through respective first and second openings formed in the upper base plate.

Implementations of the cooling assembly may also include one or more of the following features. The cooling assembly where the cold plate body includes an upper base plate, a lower base plate, and one or more intervening base plates disposed between the upper and lower base plates; the manifold lid and the upper base plate define first and second cavities; the upper base plate and the one or more intervening base plates define a third cavity; the one or more intervening base plates and the lower base plate define a fourth cavity; the first, second, third, and fourth cavities are in fluid communication through openings in the base plates to form the flow path; and the flow path sequentially includes the first cavity, the third cavity, the fourth cavity, and the second cavity. The cooling assembly where the cold plate body is formed from a monocrystalline or polycrystalline substrate may include silicon, and; the manifold lid is formed from a metal, a polymer, or an epoxy material. The cooling assembly where the manifold lid is formed of a material having a different coefficient of thermal expansion than a material used to form the one or more base plates, and the manifold lid is attached to one or more base plates by a compliant adhesive layer disposed therebetween. The cooling assembly where the cold plate body includes a recessed surface or opening in a bottom surface of the base plate directly attached to the singulated device; and the backside of the singulated device and the base plate directly attached to the singulated device define one of the one or more cavities.

One general aspect may include a device package. In one embodiment, the device package includes a package substrate having a support surface, a cooling assembly mounted on the support surface, and a package cover disposed over the cooling assembly. The cooling assembly may include any one or combination of features of the cooling assemblies described above. In some embodiments, the edges of the heat spreader are supported by a peripheral region of the support surface, and the heat spreader is spaced apart from an upper surface of the manifold lid by a gap region.

Implementations of the device package may include one or more of the following features. The device package where the heat spreader is formed from a rigid or semi-rigid material so that a force exerted on an upper surface of the heat spreader is transferred to the peripheral region of the support surface. A compliant material layer disposed between the heat spreader and the manifold lid. A molding material disposed between the heat spreader and the manifold lid, wherein the molding material at least partially encapsulates the cooling assembly. The device package where two or more cooling assemblies are mounted on the support surface of the package substrate, and the heat spreader is disposed over the two or more cooling assemblies. The device package where the second device or device stack is in thermal communication with the manifold lid through one or more thermal interface materials that form a thermal pathway between the second device or device stack, the heat spreader, and the manifold lid.

One general aspect includes a high-volume manufacturing method. In one embodiment, the method includes aligning a plurality of semiconductor devices formed in an active side of a first substrate with a plurality of cold plate bodies formed in a substrate stack. The substrate stack may include one or more second substrates, each patterned to define a base plate. The method may also include bonding a backside of the first substrate to a bonding surface of the substrate stack and singulating a plurality of cooling assemblies from the bonded first substrate and substrate stack. In one embodiment, each of the cooling assemblies may include cold plate body directly bonded to the semiconductor device, and a manifold lid attached to the cold plate body. Other embodiments of this aspect include corresponding computer assemblies, apparatus, and computer programs recorded on one or more computer storage devices, each configured to perform the actions of the methods.

Implementations of the method may include one or more of the following features. The method where the cold plate body and the manifold lid of each cooling assembly define one or more cavities in fluid communication with an inlet and outlet of the manifold lid. The method where the manifold lids are formed in a third substrate; the third substrate is attached to the second substrate stack with an intervening adhesive layer; and singulating the plurality of integrated devices may include singulating the third substrate attached to the second substrate stack. The method where a plurality of separate manifold lids are each attached to the second layer stack before singulation. The method where one or more second substrates may include monocrystalline or polycrystalline silicon. The method where a plurality of cold plate bodies in at least one of the one or more second substrates may include a recessed surface and a plurality of features protruding upward from the recessed surface. The method where the bonding surface of the second substrate stack is patterned to define a plurality of recessed surfaces; each of the recessed surfaces defines a cavity with the backside of the substrate; and the cavity is in fluid communication with an inlet and outlet of the manifold lid. The method where the side surfaces of the semiconductor device and the cold plate body in each singulated device cooling assembly are substantially coplanar with each other around a perimeter of the cooling system; and the side surfaces are substantially perpendicular to a plane of the bonding interface between the first substrate and the second substrate stack. The method where the side surfaces of the manifold lid are substantially coplanar with the side surfaces of the base plate or base plate stack around a perimeter of the cooling assembly. Implementations of the described techniques may include hardware, a method or process, or computer software on a computer-accessible medium.

One general aspect includes a device manufacturing method. In one embodiment, the method includes aligning a plurality of singulated devices with a plurality of base plates or base plate stacks defined in a first substrate stack. The first substrate stack may include one or more first substrates, each patterned to define a base plate. The method also includes bonding the backside of each of the singulated devices to a bonding surface of the first substrate stack. The method may also include singulating a plurality of cooling assemblies from the first substrate stack. Each of the cooling assemblies may include one of the plurality of semiconductor devices, a cold plate body directly bonded to the semiconductor device, and a manifold lid attached to the cold plate body.

Implementations may include one or more of the following features. The method may include bonding a plurality of support features to the bonding surface of the first substrate stack in gaps between adjacent singulated devices. The support features may be formed of the same material as the singulated devices, e.g., monocrystalline silicon. Other embodiments of this aspect include corresponding computer assemblies, apparatus, and computer programs recorded on one or more computer storage devices, each configured to perform the actions of the methods.

BRIEF DESCRIPTION OF THE DRAWINGS

The above and other objects and advantages of the disclosure will be apparent upon consideration of the following detailed description, taken in conjunction with the accompanying drawings, in which:

FIGS. 3B-3D are schematic side views of example device packages that may be used with the system panel illustrated in FIG. 2, in accordance with example embodiments of the disclosure.

Figure 1:
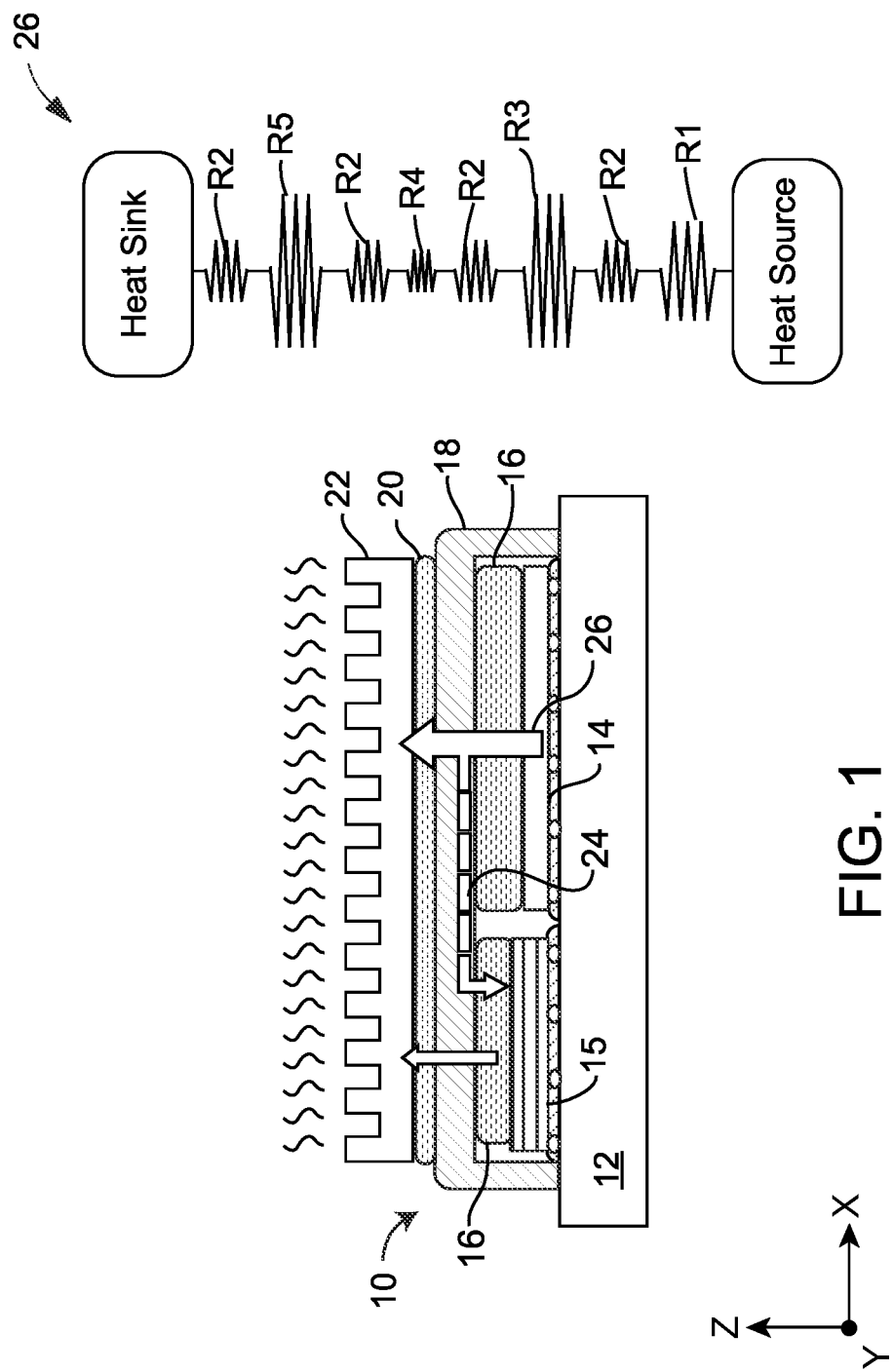
FIG. 1 is a schematic side view of a device cooling system and a schematic representation of a corresponding heat transfer path.

The figures herein depict various embodiments of the invention for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed. The term substrate also includes "semiconductor substrates" that provide a supporting material upon which elements of a semiconductor device are fabricated or attached, and any material layers, features, and/or electronic devices formed thereon, therein, or therethrough.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" are also used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," and the like are generally made with reference to the X, Y, and Z directions set forth in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements.

Unless otherwise noted, the term "cooling assembly" generally refers to a cold plate body and a manifold lid attached to the cold plate body. Typically, one or both of the cold plate body and the manifold lid are formed with recessed surfaces that define a fluid cavity therebetween. The term "cold plate body" generally refers to a base plate or a stack of base plates directly bonded to one another, which may be bonded to the semiconductor device. The cold plate body may include material layers and or metal features formed on a surface of the base plate or stack of base plates which facilitate direct dielectric or hybrid bonding with the semiconductor device. The direct bonding methods enable heat from the semiconductor device to be transferred through the cold plate body to a fluid flowing through the cooling assembly without the use of a thermal interface material. Unless otherwise noted, the cooling assemblies described herein may be used with any desired fluid, e.g., liquid, gas, and/or vapor-phase coolants, and the term "cold plate body" should not be construed as limited to any one fluid phase.

FIG. 1 is a schematic side view of a device package 10 that is conventionally cooled using an external heat sink 22. The device package 10 typically includes a package substrate 12, a first device 14, a device stack 15, and a heat spreader 18, and one or more first TIM layers 16 thermally coupling the device 14 and device stack 15 to the heat spreader 18. The device package 10 is thermally coupled to the external heat sink 22 through a second TIM layer 20. The TIM layers 16 and 20 are typically formed of a compliant material, such as a thermally conductive paste, grease, adhesive material, or other thermally conductive material, such as a fusible metal alloy and the like, e.g., solder, or combinations thereof. The TIM layers 16, 20 facilitate thermal contact between the components in the device package and between the device package 10 and the heat sink 22.

Unfortunately, as heat flux density increases through every shrinking device size, the cumulative thermal resistance of the system illustrated in FIG. 1 is increasingly problematic as heat cannot be dissipated quickly enough to allow devices to run at optimal power, thus reducing the device's energy efficiency. Also problematic is the heat is transferred between devices within the package, such as the illustrated heat transfer path 24, where heat may be undesirable transferred from a high heat flux device 14, such as a CPU or GPU, to a low heat flux device stack 14, such as memory, through the heat spreader 18.

For example, as shown in FIG. 1, each package component and the respective interfacial boundaries therebetween has a corresponding thermal resistance (R1-R5). Here, R1 is the thermal resistance of the bulk semiconductor material of the device 14, R3 and R5 are the thermal resistance of the respective TIM layers 16, 20, R4 is the thermal resistance of the heat spreader 18, and R2 represents the thermal resistance at the interfacial region of the components. In a typical cooling system, R3 and R5 may account for 80% or more of the cumulative thermal resistance of the heat transfer path 26 and R4 may account for 5% or more, while R1 of the device 14 and R2 of the interfaces account for the remaining. Accordingly, embodiments herein provide for embedded cooling assemblies that shorten the thermal resistance path between a device and a heat sink and, in some embodiments, reduce thermal communication between devices disposed in the same package, such as described in relation to the figures below.

Figure 2:
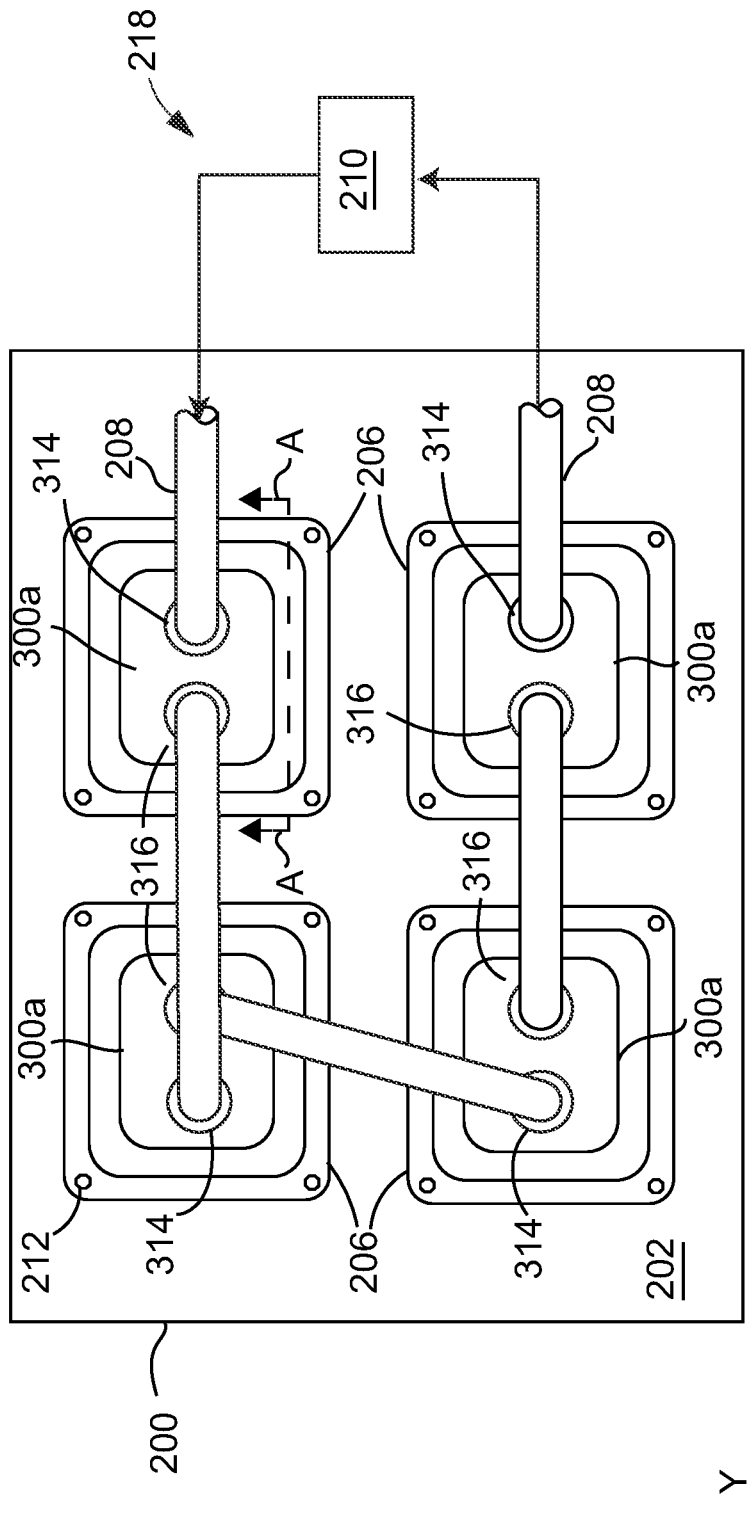
FIG. 2 is a schematic top-down view of an example system panel configured with a plurality of device packages, each having an embedded cooling assembly, in accordance with example embodiments of the disclosure.
Figure 3A:
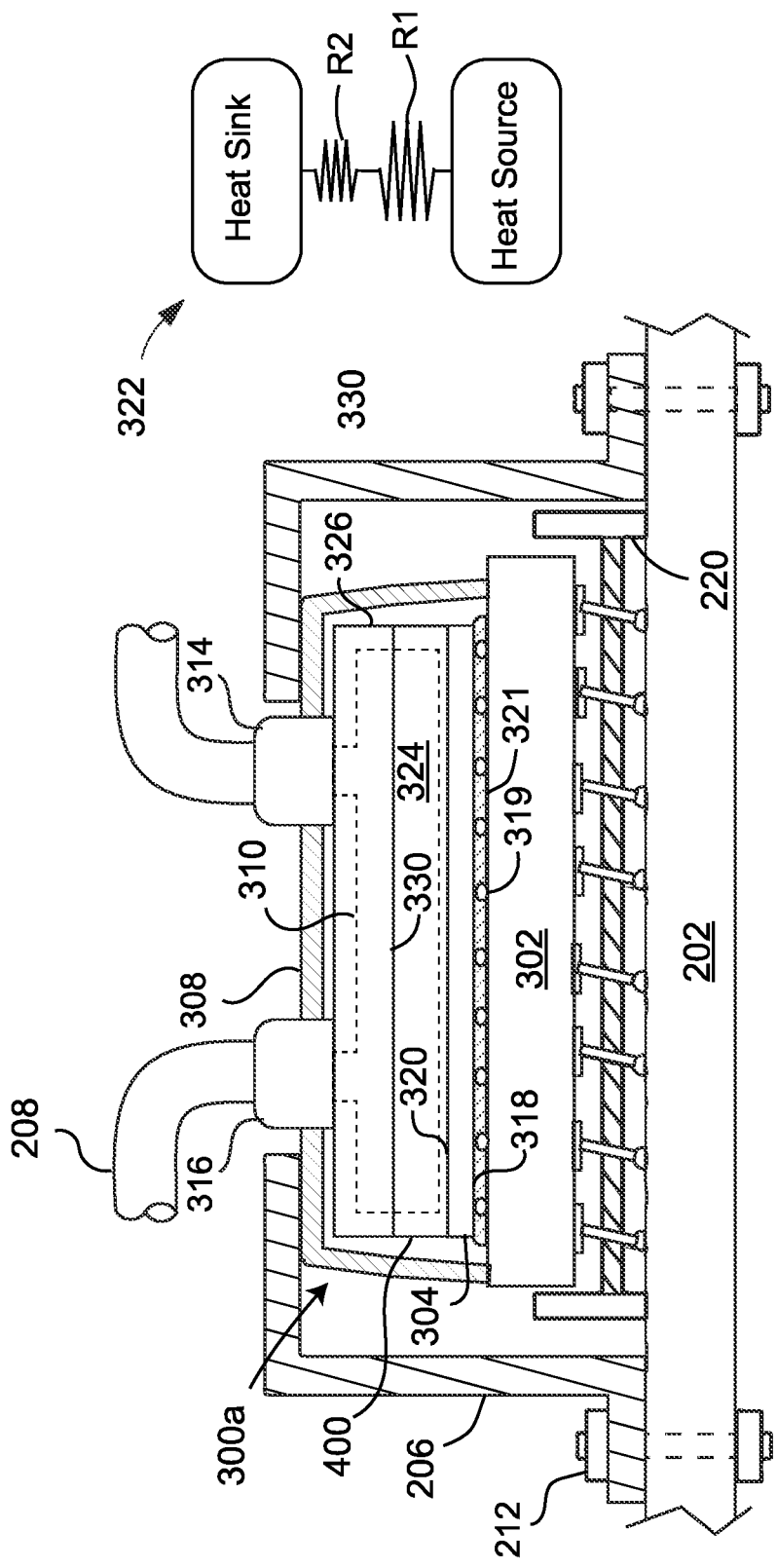
FIG. 3A is a schematic side view of an example device package taken along line A-A of FIG. 2.

FIG. 2 shows a plan view of an example system panel 200. FIG. 3A is a schematic sectional view of a portion of the system panel 200 taken along line A-A, which illustrates an example device package 300a with an embedded cooling assembly 400, according to example embodiments of the disclosure. Here, the cooling assembly 400 is attached to a backside 320 of a semiconductor device 304 by direct dielectric-to-dielectric bonds formed therebetween.

In some embodiments, the cooling assembly 400 is attached to the backside 320 by a hybrid of direct dielectric-to-dielectric and metal-to-metal bonds, such as described in relation to FIG. 4 below. The cooling assembly 400 is typically disposed between the device 304 and a package cover 308 and is thus "embedded" in the device package 300a. In some embodiments, the package cover 308 is formed of a thermally conductive material, e.g., a metal, and functions as a heat spreader.

Referring back to FIG. 2, the system panel 200 generally includes a printed circuit board (PCB) 202, a plurality of device packages 300a mounted to the PCB 202, and a coolant delivery system 218 fluidly coupled to each of the device packages 300a. The coolant delivery system 218 may include a coolant fluid source 210 and a plurality of coolant lines 208 fluidly coupling the coolant fluid source 210 to respective inlets 314 and outlets 316 of the device packages 300a. In some embodiments, the cooling assembly 400 is configured to transfer heat from the device 304 to a liquid coolant, such as water or a refrigerant, delivered to the cooling assembly from the coolant fluid source 210. In some embodiments, the cooling assembly 400 transfers heat from the device by vaporizing the refrigerant. In those embodiments, the coolant delivery system 218 may include a compressor (not shown) external to the device packages 300a to condense the vapor back to a liquid form.

As shown, each of the device packages 300a may be installed in a socket 220 (FIG. 3A) of the PCB 202 and secured thereto using a frame-shaped cover 206, which is secured to the PCB 202 using a plurality of fasteners 212. In some embodiments, the cover 206 may exert a downward force on the device package 300a sufficient to ensure relatively uniform force loading and thus proper pin contact between the device package 300a and the socket 220. In other embodiments, the device packages 300a may be installed using other suitable connection methods, such as solder ball attachment or direct bond interconnects (DBI).

Figure 3D:
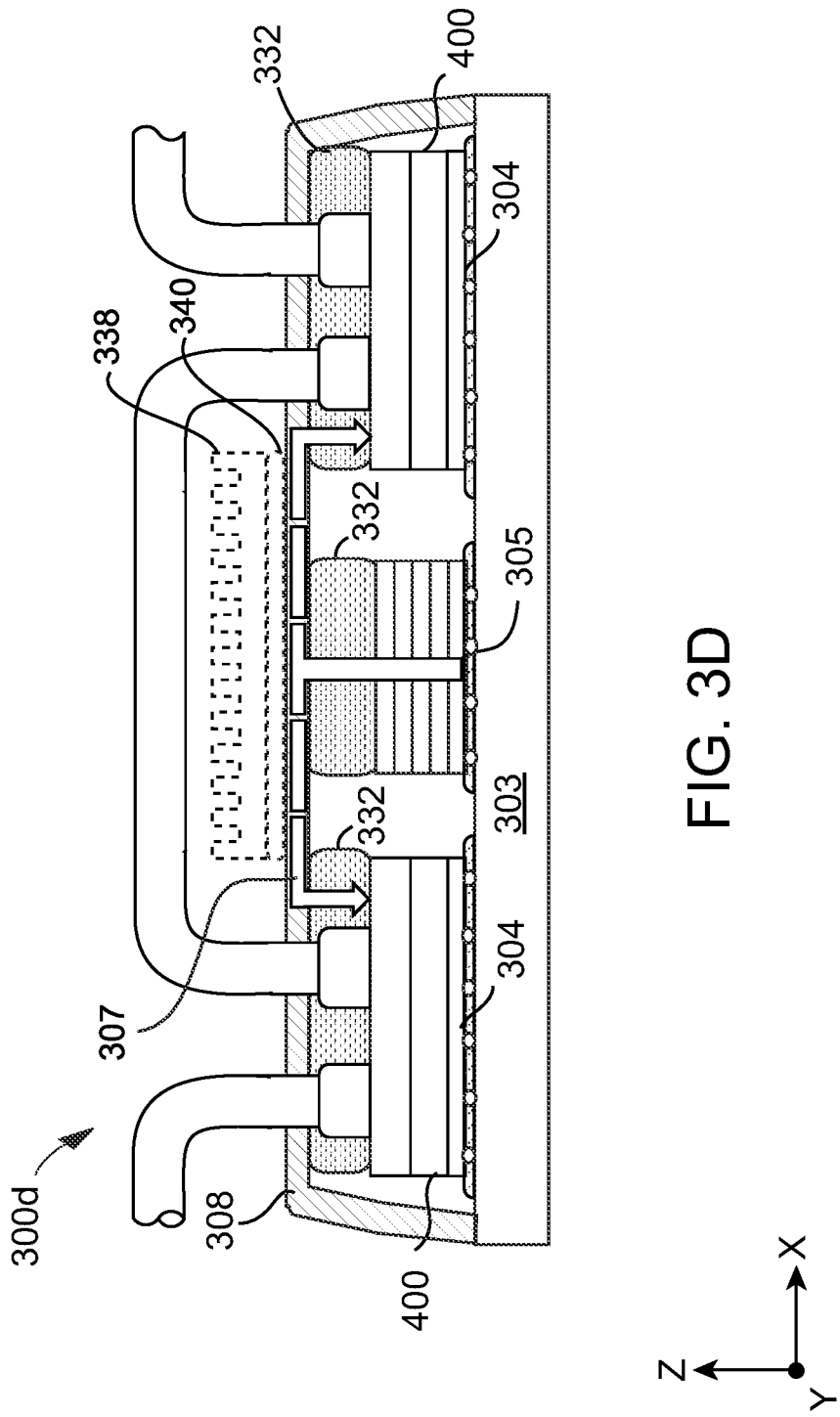

Turning again to FIG. 3A, the device package 300a includes a package substrate 302, the semiconductor device 304 disposed on the package substrate, the cooling assembly 400, and a package cover 308 disposed over the embedded cooling assembly 400. The package substrate 302 is typically formed of a rigid material, such as an epoxy or resin-based laminate, and may include a plurality of conductive elements formed therein or thereon for electrically connecting the device 304 to the PCB 202. In some embodiments, an interposer 303 may be used in place of the package substrate 302. In those embodiments, the interposer 303 may be configured to electrically connect multiple devices to one another in an advanced packaging scheme, such as shown in FIG. 3D.

In some embodiments, the device 304 has an active side 318 that includes device components, e.g., transistors, resistors, and capacitors, formed thereon or therein, and a non-active or "backside" surface, here the backside 320 disposed opposite the active side 318. As shown, the active side 318 is electrically connected to the package substrate 302 by use of conductive bumps 319, which are encapsulated by an underfill layer 321 disposed between the device 304 and the package substrate 302. The underfill layer 321 typically comprises a cured polymer resin or epoxy that provides mechanical support to the conductive bumps 319 and protects against thermal fatigue that may be caused by a mismatch in CTEs between the device 304 and the package substrate 302.

As shown, the cooling assembly 400 is disposed between the device 304 and the package cover 308 and is thus "embedded" within the device package 300a. Here, the package cover 308 extends upwardly from a surface of the package substrate 302 to surround the device 304 and the cooling assembly 400. In some embodiments, the package cover 308 may be formed of semi-rigid or rigid material and may be spaced apart from the manifold lid 326 so that a downward force exerted on the package cover 308 by the cover 206 is transferred to the package substrate 302 and is not exerted on the manifold lid 326.

The cooling assembly 400 generally includes a cold plate body 324 directly bonded to the device 304 and a manifold lid 326 coupled to the cold plate body 324 by use of an adhesive layer 330. Here, the cold plate body 324 and the manifold lid 326 coupled to the cold plate body 324 define a cavity 310 (shown in phantom). Coolant is circulated to cavity 310 through the lines 208, which may be coupled to the cooling assembly 400 by fittings disposed in openings that form the inlet 314 and outlet 316 of the manifold lid 326. In some embodiments, the cooling assembly 400 may be thermally coupled to the backside 320 of the device 304 using a method that forms direct bonds between the surfaces without the use of an intervening adhesive, such as described in relation to the manufacturing methods below. The direct bonding method eliminates the need for an intervening adhesive layer or thermal interface material (TIM) layer between the device 304 and the cooling assembly 400. Thus, the device packages described herein provide for a reduced thermal path resistance 322 when compared to path 26 of the device package 10 illustrated in FIG. 1. In some embodiments, the cumulative thermal resistance of path 322 is reduced by 50X or more when compared to path 26 of the device package 10.

FIGS. 3B-3D illustrate respective device packages 300b-d, according to example embodiments of the disclosure, that may be used in place of any one of the device packages 300a described in FIGS. 2 and 3A. In FIG. 3B, the device package 300b is substantially similar to the device package 300a and further includes a thermally conductive compliant material 332, such as a paste, putty, or non-rigid polymer material, disposed between the manifold lid 326 and the package cover 308. In some embodiments, the compliant material 332 is a thermal interface material. In the embodiment of FIG. 3C, the device package 300c is substantially similar to the device package 300a and further includes a molding material 334 disposed between the manifold lid 326 and the package cover 308. The molding material 334 may include a polymer or epoxy material that extends up from the package substrate to at least partially encapsulate and/or surround the device 304 and the cooling assembly 400. In some embodiments, the molding material 334 may be a thermally conductive material, such as a polymer or epoxy having one or more thermally conductive additives, such as silver and/or graphite. When used, the compliant material 332 and/or the molding material 334 provides mechanical support that improves system reliability and extends the useful lifetime of the device package 300b-c. For example, the compliant material 332 and/or the encapsulating molding material 334 may reduce mechanical stresses that can weaken interfacial bonds and/or electrical connections between the components of the device package 300a, such as stresses caused by vibrations, mechanical and thermal shocks, and/or fatigue caused by repeated thermal cycles.

In some embodiments, the package cover 308 is formed of a thermally conductive material, e.g., a metal such as aluminum or copper. In some embodiments, the package cover 308 is a heat spreader that redistributes heat from one or more electronic components within a multi-component device package, such as illustrated in FIG. 3D.

FIG. 3D illustrates an example multi-component device package 300d, which includes a plurality of devices mounted on a common package substrate, e.g., an interposer 303, that facilitates shortened connections between the devices 304 and/or device stacks 305. As shown, the plurality of devices includes device 304 directly bonded to a cooling assembly 400 and a device stack 305, e.g., a stack of interconnected memory devices that are not directly bonded to an embedded cooling assembly 400. Here, the package cover 308 may be formed of a thermally conductive material and function as a thermal spreader that transfers heat from the device stack. The compliant material 332 may be disposed between and in thermal contact with the package cover 308 and each of the cooling assemblies 400 and between the package cover 308 and the device stack 305. Thus, heat generated by each of the devices 304 is dissipated through the cooling assemblies 400 directly bonded thereto, and heat generated by the device stack 305 is transferred to the cooling assemblies 400 of the adjacent devices 304 via the compliant material 332, e.g., TIM layers, and the package cover 308, as shown by the thermal path 307.

In some embodiments, the device package 300d includes a heat sink 338 (shown in phantom) disposed above the package cover 308 and a TIM layer 340 thermally coupling the package cover 308 to the heat sink 338. In some embodiments, the device package 300d may include an external cooling assembly, e.g., a fluid cooled pipe (not shown), disposed on the package cover 308 and thermally coupled to the package cover 308 by the TIM layer 340. In those embodiments, the fluid cooled pipe may be coupled to the same coolant source used to deliver coolant to the cooling assemblies 400 or may be coupled to a different coolant source.

Beneficially, the cooling assemblies 400 of device package 300d block a thermal pathway between each of the devices 304 and the device stack 305 and prevent heat from transferring therebetween. Thus, the device package 300d may be advantageously used to facilitate closely spaced devices on an interposer, such as high-power devices and memory stacks, to provide for reduced latency while simultaneously eliminating undesirable heat transfer therebetween.

Figure 4:
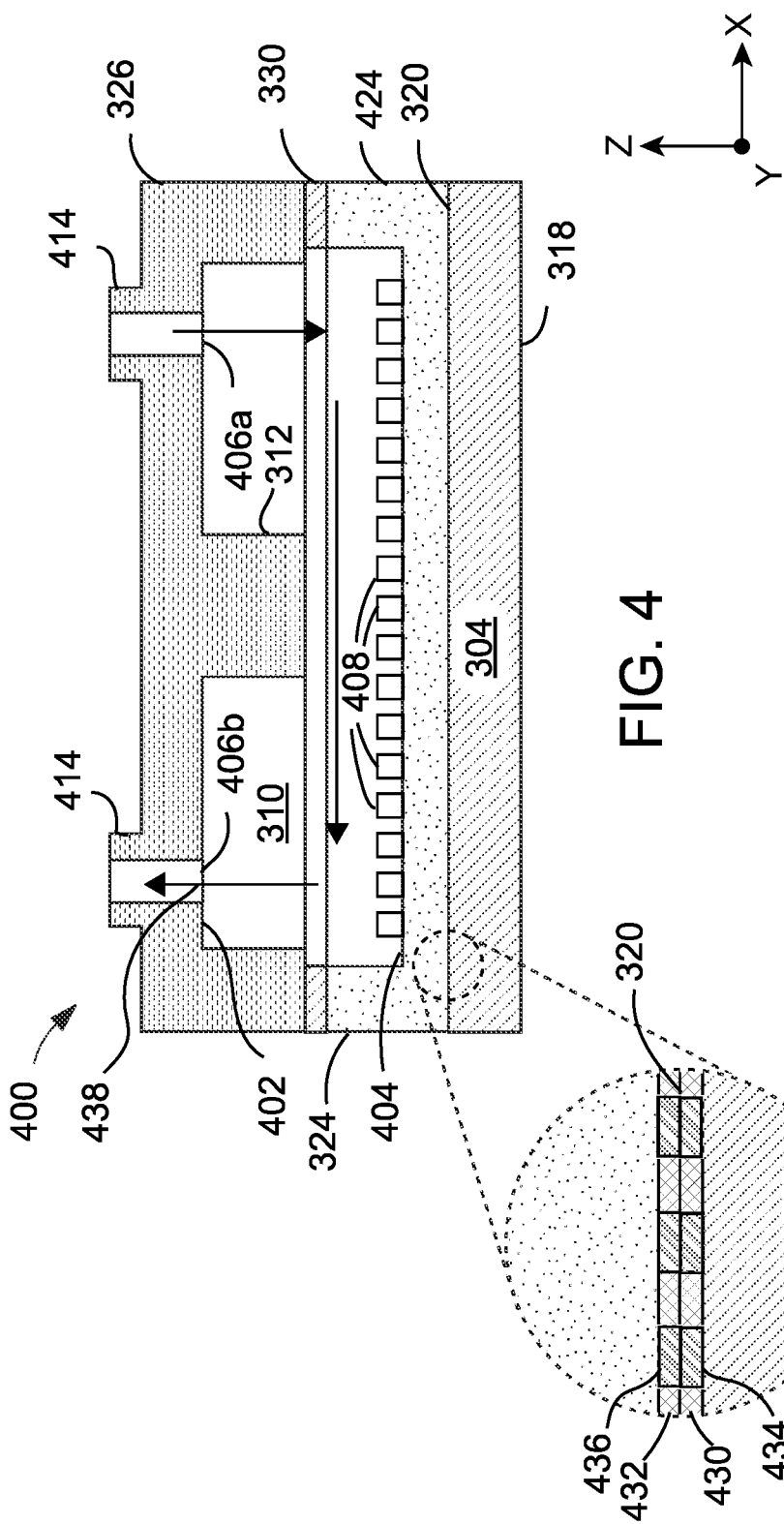
FIGS. 4-7 are schematic sectional views of embedded cooling assemblies, in accordance with example embodiments of the disclosure.

FIG. 4 is a schematic sectional view of the cooling assembly 400 used with the device packages 300a-d described above. As shown, the cooling assembly 400 includes a cold plate body 324 and a manifold lid 326 attached to the cold plate body 324. The cold plate body 324 may include one or more base plates, as described in relation to FIGS. 5-7 below, or may comprise a single base plate 424 as shown in FIG. 4. In some embodiments, the cold plate body 324 is directly attached to the device 304 without the use of an adhesive or TIM material, e.g., by using a direct bonding method. For example, in some embodiments, the device 304 may comprise a dielectric material layer 430 formed on the backside 320, and cold plate body 324 may comprise a dielectric material layer 432 formed on a bottom surface of the base plate 424. In those embodiments, the cold plate body 324 may be attached to the backside 320 through direct dielectric bonds formed between the material layers 430 and 432. Suitable dielectrics that may be used as the dielectric material layers 430, 432 include silicon oxides, silicon nitrides, silicon oxynitrides, silicon carbon nitrides, metal-oxides (e.g., alumina), metal-nitrides, silicon carbide, silicon oxy-carbides, silicon oxycarbonitride, silicon carbonitride, diamond-like carbon (DLC), or combinations thereof. In some embodiments, one or both of the dielectric material layers 430, 432 formed of an inorganic dielectric material, i.e., a dielectric material substantially free of organic polymers.

Typically, one or both of the layers 430 and 432 are deposited to a thickness greater than the thickness of a native oxide, such as about 1 nm or more, 5 nm or more, 10 nm or more, 50 nm or more, 100 nm or more, or 200 nm or more. In some embodiments, one or both of the layers 430, 432 are deposited to a thickness of 3000 nm or less, such as 200 nm or less, 100 nm or less, or 500 nm or less. In some embodiments, the direct dielectric bonds are formed using only one of the layers 430, 432. For example, the dielectric bonds may be formed by depositing a dielectric material layer on either the cold plate body 324 or the singulated device 304 but not both.

In some embodiments, each of the lower surface of the cold plate body 324 and the backside 320 of the device 304 further includes a plurality of metal features 434, 436, such as copper damascene pads, formed in the respective dielectric material layers 430, 432. In those embodiments, the cold plate body 324 and the device 304 may be attached using a hybrid of direct dielectric bonds formed between the dielectric material layers 430 and 432 and direct metal bonds formed between the metal features 434 and 436. Methods for forming the hybrid bonds are described below. In some embodiments, the base plate 424 may be formed of a material having a coefficient of thermal expansion CTE substantially similar to the CTE of the bulk semiconductor substrate of device 304. For example, the device 304 may be formed on a monocrystalline silicon substrate, and the base plate 424 may be formed from a monocrystalline silicon or polycrystalline silicon substrate.

Because silicon substrates are typically too brittle to reliably connect the cooling assembly 400 to a coolant delivery line, the manifold lid 326 may be formed from a different material than the cold plate body 324. In some embodiments, the manifold lid 326 may be formed using a relatively ductile material, e.g., a metal, polymer, or laminate that is less brittle than the material used to form the cold plate body 324. Here, the manifold lid 326 may be attached to the cold plate body 324 by use of an adhesive layer 330 disposed therebetween. In some embodiments, the adhesive layer 330 is relatively compliant in order to absorb movement between the manifold lid 326 and the cold plate body 324 caused by differences in the CTEs of the different materials across repeated thermal cycles.

As shown in FIG. 4, the base plate 424 includes a first recessed surface 404, and the manifold lid 326 includes one or more second recessed surfaces 402 that are aligned with the first recessed surface 404 so that the base plate 424 and the manifold lid 326 collectively define a fluid cavity 310 therebetween. Here, the cavity 310 is fluidly connected to inlet and outlet openings 406a-b disposed through the manifold lid 326 to form a coolant flow pathway 438. As shown, the manifold lid 326 further includes a divider wall 312 that extends downwardly into the cavity 310. The divider wall 312 separates an inlet region of the cavity 310 from an outlet region and directs fluid into a recessed region of the cold plate body 324. The divider wall 312 thus prevents fluid from taking a less resistant flow path directly from the inlet 406a to the outlet 406b. In some embodiments, the manifold lid 326 includes connector features 414 that extend upwardly from a surface of the manifold lid 326 and/or threads (not shown) formed in the sidewalls of the openings 406a-b. The connector features 414 and/or threads facilitate attachment of a coolant delivery line or fittings used to couple the manifold lid 326 to a coolant delivery line, e.g., line 208 (FIG. 2). In some embodiments, the cooling assembly 400 includes a plurality of protruding features 408, such as fins, columns, or pillars that extend upwardly from the recessed surface 404 of the base plate 424. The protruding features 408 may be used to disrupt laminar fluid flow at the interfacing surfaces of the coolant and the base plate 424 in order to increase heat transfer therebetween.

Figure 5:
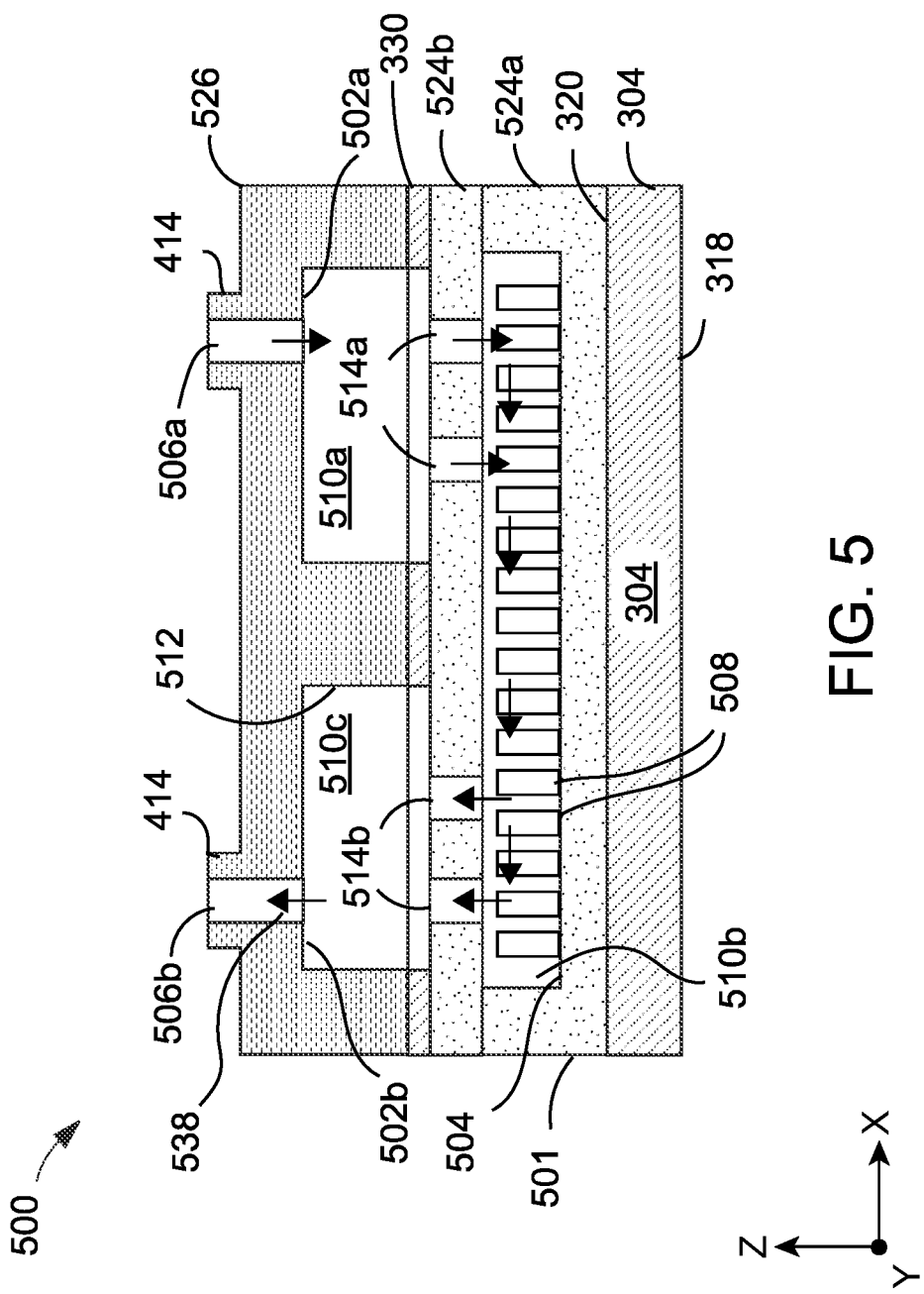
Figure 6:
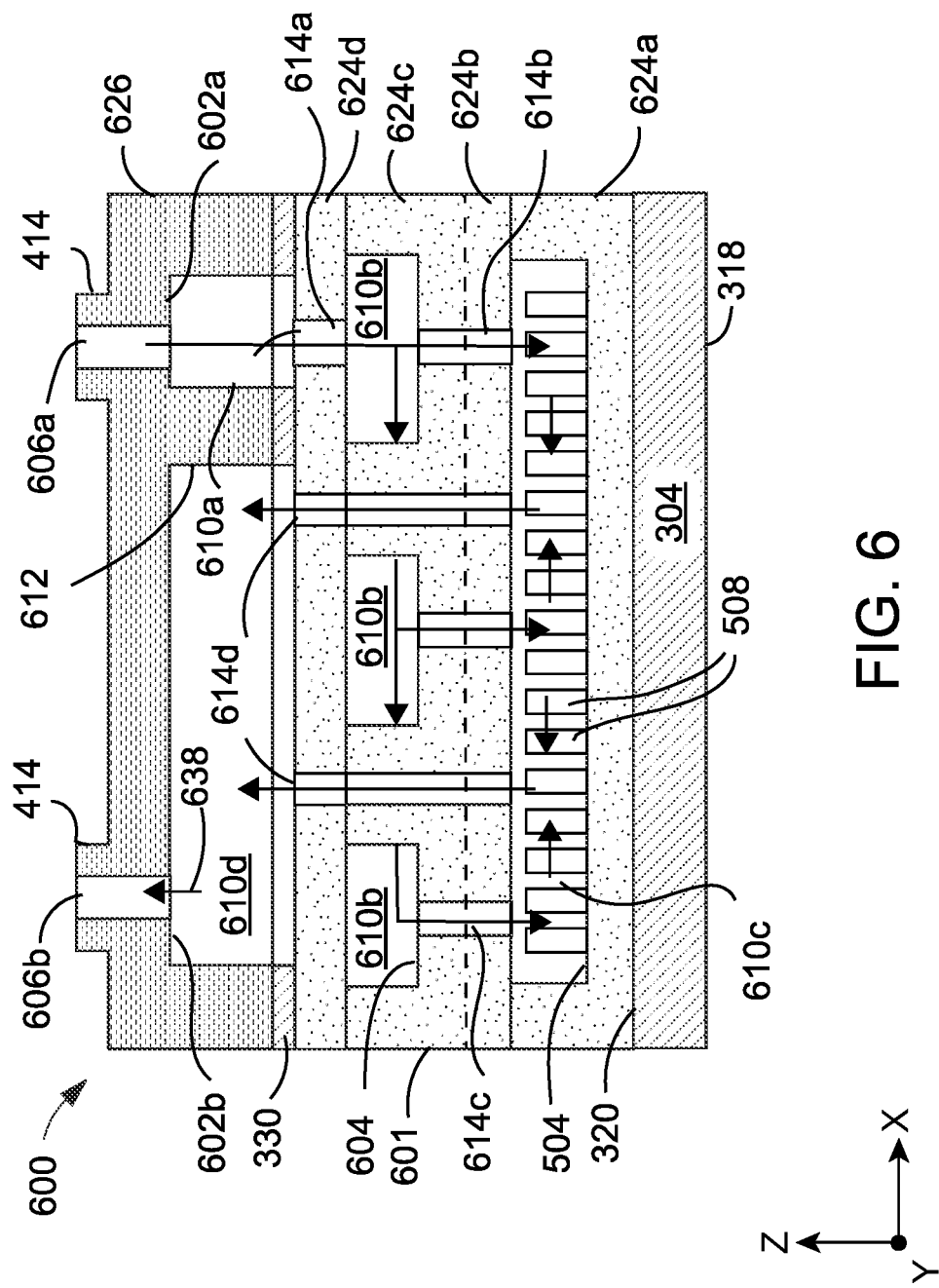
Figure 7:
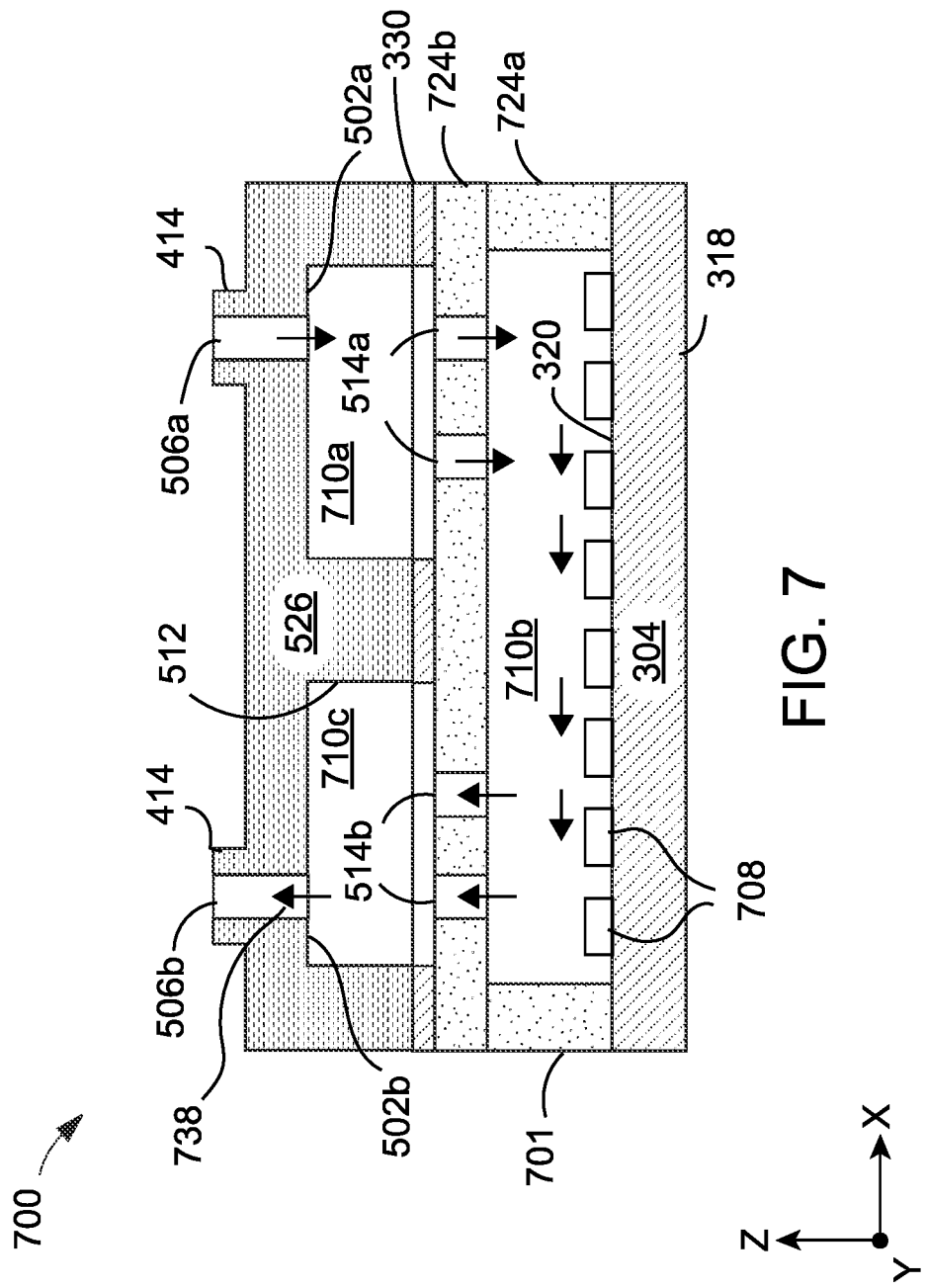

FIGS. 5-7 illustrate example assemblies 500, 600, and 700 that may be used in place of the cooling assembly 400 described above. In the example shown in FIG. 5, the cooling assembly 500 includes a cold plate body 501 and a manifold lid 526 attached to the cold plate body 501 by use of an adhesive layer 330. As shown, the manifold lid 526 is formed to include at least two recessed surfaces 502a-b that are separated from each other by a divider wall 512. The cold plate body 501 and the manifold lid 526 collectively define a plurality of fluidly connected cavities 510a-c that form a tortuous flow pathway 538 between the inlet opening 506a and the outlet opening 506b.

As shown, the cold plate body 501 includes a first base plate 524a that is substantially similar to the base plate 424 and a second base plate 524b disposed between the first base plate 524a and the manifold lid 526. The second base plate 524b separates the at least two recessed surfaces 502a-b from a recessed surface 504 in the first base plate 524a. Here, the respective recessed surfaces 502a-b and 504 and the second base plate 524b collectively define at least three cavities 510a-c, which are fluidly connected through openings 514a-b disposed through the second base plate 524b. In one embodiment, the cooling assembly 500 defines a flow pathway 538 that sequentially includes (in the direction of flow) the inlet opening 506a, the first cavity 510a, two or more openings 514a fluidly connecting the first cavity 510a to the second cavity 510b, the second cavity 510b, two or more openings 514b fluidly connecting the second cavity 510b to the third cavity 510c, the third cavity 510c, and the outlet opening 506b.

In some embodiments, a plurality of protruding features 508 are formed to extend upwardly from the recessed surface 504. The protruding features 508 disrupt laminar flow at the interface between a coolant fluid and the recessed surface 504 to increase heat transfer therebetween. In some embodiments, the protruding features 508 define flow channels in the second cavity 510b that may be used to increase the flow rate of coolant therethrough. In some embodiments, a ratio of a height of the protruding features 508 to a height of the second cavity 510b (measured in the Z-direction) is about 1:3 or more, such as about 1:2 or more, or 2:3 or more, or for example, about 3:4 or more.

In the example embodiments illustrated in FIG. 6, the cooling assembly 600 includes a cold plate body 601 and a manifold lid 626 attached to the cold plate body 601 by use of an adhesive layer 330. Here, the cold plate body 601 and the manifold lid 626 collectively define a plurality of fluidly connected cavities 610a-d. The cold plate body 601 includes a lower base plate 624a, an upper base plate 624d, and one or more intervening base plates 624b-c (two shown) disposed between the lower base plate 624a and upper base plate 624d. The manifold lid 626 includes a first recessed surface 602a and a second recessed surface 602b, which are separated from each other by a dividing wall 612 so that the manifold lid 626 and the upper base plate 624d define at least two cavities 610a and 610d. The one or more intervening base plates 624b-c have a recessed surface 604 formed on a side facing the upper base plate 624d so that the one or more intervening base plates 624b-c and the upper base plate 624d define a cavity 610b. Here, the lower base plate 624a is substantially similar to the lower base plate 524a of FIG. 5 and is formed to have a recessed surface 504 and a plurality of protruding features 508 extending upwardly from the recessed surface 504. The one or more intervening base plates 624b-c and the lower base plate 624a define a cavity 610c.

As shown, of the cavities, 610a-d are in fluid communication with one another through openings 614a-d formed through the base plates 624a-d. The openings 614a-d and the cavities 610a-d collectively define a coolant flow path 638. In one embodiment, the flow path 638 sequentially includes (in the flow direction) the inlet opening 606a, the first cavity 610a, a first opening 614a disposed through the upper base plate 624d, the second cavity 610b, one or more second openings 614b disposed through the one or more intervening base plates 624b-c, the third cavity 610c, one or more third openings 614c disposed through the one or more intervening base plates 624b-c and the upper base plate 624d, the fourth cavity 610d, and the outlet opening 606b.

In the example illustrated in FIG. 7, a cooling assembly 700 includes a cold plate body 701 and a manifold lid 526 that collectively define the fluidly connected cavities 710a, 710b, and 710c. Here, the cold plate body 701 includes a lower base plate 724a having a plurality of sidewalls directly bonded to a peripheral region of the backside 320 of the device 304, a second base plate 724b disposed on the lower base plate 724a, and a manifold lid 526 disposed on and attached to the second base plate 524b by use of the adhesive layer 330. The lower base plate 724a, the second base plate 724b, and the backside 320 of the device 304 define the cavity 710b, where the backside 320 is directly exposed to the fluid pathway 738 without an intervening portion of the cold plate body 701 disposed therebetween.

In FIG. 7, the manifold lid 526 and the second base plate 724b are substantially the same as described in relation to FIG. 5 so that the flow path consecutively includes the inlet opening 506a, the first cavity 710a, one or more first openings 514a, the second cavity 710b, one or more second openings 514b, the third cavity 710c and the outlet opening 506b. However, it is contemplated that the lower base plate 724a may be used as the first or lower base plate of any one of the example cooling assemblies described herein. In such embodiments, at least one cavity is partially defined by the device 304 and the backside 320 is directly exposed to a coolant respectively flowed therethrough. It is believed that the reduced surface area of the lower base plate 724a (when compared to the backside surface of the device 304) allows for a greater CTE mismatch between the respective substrate materials without sacrificing the reliability of the bond joint across repeated thermal cycles. In some embodiments, the surface area of the lower base plate 724a at the bonding interface is about 60% or less than the surface area of the device 304, such as about 50% or less, 40% or less, 30% or less, or for example, about 20% or less.

In some embodiments, the device 304 includes a plurality of raised or protruding features 708 formed in or on the backside 320. The protruding features 708 increase fluid turbulence (disrupt laminar flow) at the boundary of the coolant fluid and the backside 320, thus increasing the rate of heat transfer from the device 304 to the coolant fluid. To further increase heat dissipation from the device, the features 708 may be formed of a thermally conductive metal, such as copper, which can be formed using any suitable process, such as a lithography and etch process.

It should be noted that the substrates used to form the cold plate bodies described above are not limited to crystalline silicon as it is contemplated that one or both of the cold plate body and the manifold lid may be formed from a bulk substrate material comprising metal, metal alloys, ceramics, composite materials or other low CTE materials suitable for the bonding using the methods described below. For example, the cold plate body may be formed from a bulk material selected from the group comprising copper, aluminum, copper alloys (e.g., copper molybdenum alloys and copper tungsten alloys), iron-cobalt nickel alloys (e.g., Kovar® from Magellan Industrial Trading Co., Inc. of South Norwalk Connecticut USA), iron-cobalt nickel silver alloys, iron-nickel alloys (e.g., Invar® superalloys from Magellan), iron-nickel silicon alloys, aluminum silicon carbides, aluminum-silicon alloys, beryllium, beryllium oxides, beryllium, and beryllium oxide composites, aluminum-graphite fibers, copper-graphite fibers, metal diamond composite materials (e.g., aluminum diamond composites and silver-diamond composites), metal oxides, metal nitrides, and combinations thereof. The non-crystalline silicon substrate materials may be prepared for bonding as described below and may or may not include a dielectric material layer deposited on the lower bonding surface. In some embodiments, both the manifold lid and the cold plate body may be formed from a non-crystalline silicon bulk substrate material. In such embodiments, the manifold lid may be attached to the cold plate body with or without an intervening adhesive layer.

Figure 8:
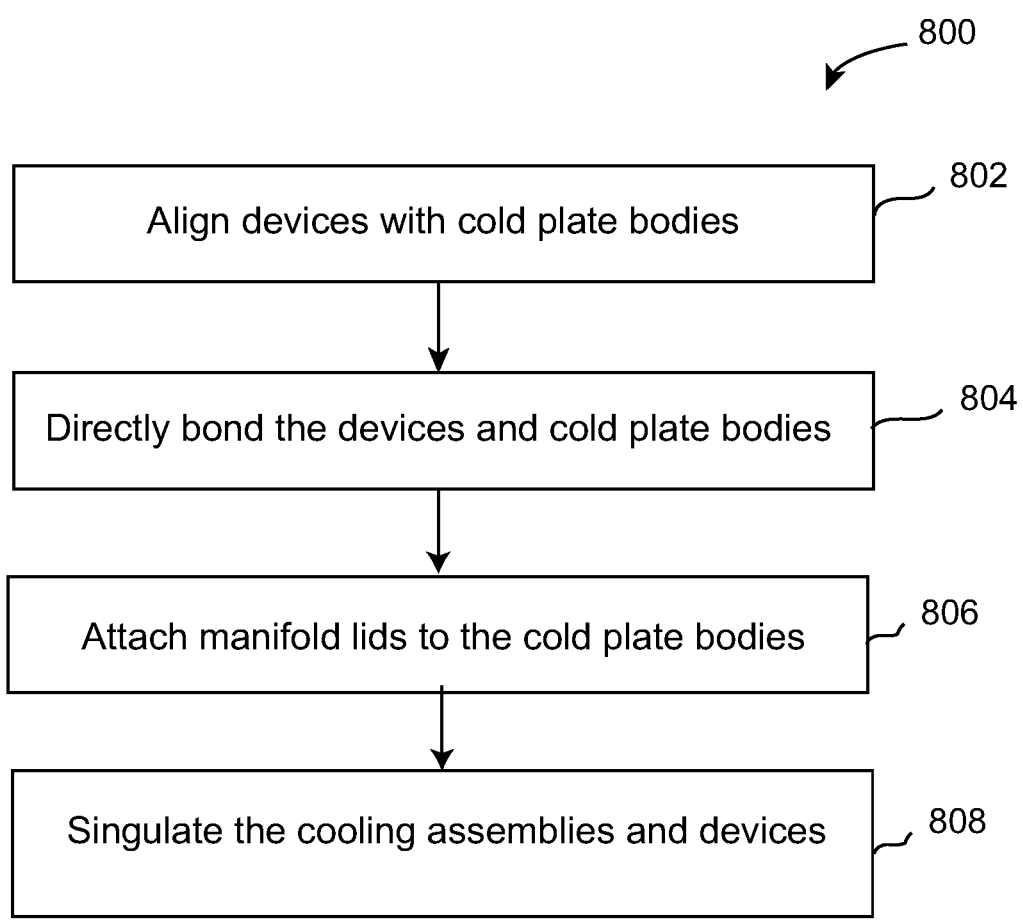
FIG. 8 is a flow diagram of a method of manufacturing cooling assemblies, in accordance with example embodiments of the disclosure.

FIG. 8 is a flow diagram of a method for manufacturing the cooling assemblies described above. Generally, the method includes bonding a substrate comprising a plurality of pre-singulated semiconductor devices to a substrate comprising a plurality of pre-singulated cooling assemblies to form a bonded substrate stack and singulating, e.g., dicing, individual cooling assemblies from the substrate stack. FIGS. 9A-9D and 10A-10B are schematic side sectional views of substrates that illustrate aspects of the manufacturing method set forth in FIG. 8.

At block 802, the method 800 includes aligning a first substrate 902 with a second substrate 904, where the first substrate 902 includes a plurality of pre-singulated die, e.g., semiconductor devices 304, and the second substrate 904 includes a plurality of pre-singulation cold plate bodies 901. The cold plate bodies 901 may be formed from one or more base plates 924a-b (two shown), according to any one of the embodiments described above in FIGS. 4-7. As shown, the first substrate 902 includes an active side 318, and a backside 320 opposite the active side 318, where the active side 318 includes the plurality of semiconductor devices 304. Generally, the plurality of semiconductor devices 304 are arranged in a rectangular array and are spaced apart from one another by a plurality of scribe lines 906 that extend in the X and Y directions to form a grid pattern. The plurality of scribe lines 906 may be defined by the boundaries of the semiconductor devices 304 formed in the active side 318 and typically do not extend through the thickness of the substrate 902 prior to singulation.

The first substrate 902 may include a bulk material and a plurality of material layers disposed on the bulk material. The bulk material may include any semiconductor material suitable for manufacturing semiconductor devices, such as silicon, silicon germanium, germanium, group III-V semiconductor materials, group II-VI semiconductor materials, or combinations thereof. For example, in some embodiments, the first substrate 902 may include a monocrystalline wafer, such as a silicon wafer, a plurality of device components formed in or on the silicon wafer, and a plurality of interconnect layers formed over the plurality of device components. In other embodiments, the substrate may comprise a reconstituted substrate, e.g., a substrate formed from a plurality of singulated devices embedded in a support material.

The bulk material of the first substrate 902 may be thinned after the devices 304 are formed using one or more backgrind, etching, and polishing operations that remove material from the backside 320. Thinning the first substrate 902 may include using a combination of grinding and etching processes to reduce the thickness (in the Z-direction) to about 450 um or less, such as about 300 um or less, or about 150 um or less. After thinning, the backside 320 may be polished to a desired smoothness using a chemical mechanical polishing (CMP) process, and the dielectric material layer 430 may be deposited thereon. In some embodiments, the dielectric material layer 430 may be polished to a desired smoothness to prepare the substrate 902 for the bonding process. In some embodiments, the method 800 includes forming the plurality of metal features 434 (FIG. 4) in the dielectric material layer 430 in preparation for a hybrid bonding process, such as by use of a damascene process.

In some embodiments, the active side 318 is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

Here, the second substrate 904 is formed of a plurality of substrates 904a-b (two shown), each comprising a unitary bulk material patterned to define a respective plurality of base plates 924a-b. Each of the plurality of substrates 904a-b may have substantially the same size and shape as the first substrate 902 when viewed from top-down (in the Z-direction) so that the interfacing surfaces are substantially coextensive with one another. In some embodiments, each of the substrates 904a-b has a thickness (in the Z-direction) of between about 0.5 mm and about 10 mm, or between about 1 mm and about 8 mm, or between about 1 mm and 6 mm, such as about 0.5 mm or more, such as about 1 mm or more, or about 2 mm or more, or about 10 mm or less, such as about 8 mm or less, or about 6 mm or less.

In some embodiments, the substrates 904a-b are each patterned using a combination of lithography and etch processes. For example, in some embodiments, patterning the surface of a substrate 904a-b includes patterning a mask layer using a lithography process and removing material from a surface of the substrate 904a-b by exposing the surface to a chemically reactive etchant through openings in the mask layers. In some embodiments, the substrates 904a-b are each patterned using a micro-abrasion process where micro-abrasive particles are directed towards the substrate surface through openings formed in a mask template or mask layer disposed thereover or thereon. It should be noted that in each of the example embodiments described above, the sidewalls of the cavities extending from the respective recessed surfaces 404, 504, 604 and the sides of the protruding features 408 and 508 are shown as having substantially vertical orientations, such as would result from a typical isotropic etch process. However, it is contemplated that the openings maybe be also be formed using an anisotropic etch process and that the sidewalls of the cavities or the sides of the features may be sloped with respect to the recessed surfaces. In other embodiments, e.g., where the cold plate bodies comprise a non-crystalline silicon material such as metal, metal alloys, ceramics, or composite material described above the patterns may be formed using any suitable method, e.g., machining, casting, forging, molding, or the like.

As shown, the one or more substrates 904a-b are aligned with and directly bonded to one another to form the second substrate 904. In some embodiments, each of the substrates 904a-b are formed of a bulk material that includes or consists essentially of silicon, e.g., monocrystalline silicon or polysilicon, and the surfaces of the substrates 904a-b are directly bonded to each other using a direct silicon bonding or silicon fusion bonding method. For example, the silicon surfaces of the substrates 9004a-b may be treated using a plasma or fluoride-containing etchant, aligned and contacted with one another, and then heated to a temperature greater than about 700° C., such as between 800° C. and 1000° C. to generate silicon-to-silicon bonds. In some embodiments, the substrates 904a-b may be bonded through direct bonds formed between dielectric material layers formed on the bulk substrate materials, such as the direct bonding method described in relation to block 804.

In some embodiments, the substrates 904a-b are each formed of the same bulk material or from different bulk materials having substantially similar coefficients of linear thermal expansion (CTE), where the CTE is a fractional change in length of the material (in the X-Y plane) per degree of temperature change. In some embodiments, the substrate(s) 904a-b are formed of a material having a CTE that is substantially similar or "matched" to the CTE of the bulk material used to form the first substrate 902. In some embodiments, the CTEs of the respective substrates 902 and 904a-b are matched so that the CTE of the substrate(s) 904a-b is within about +/−20% or less of the CTE of the first substrate 902, such as within +/−15% or less, within +/−10% or less, or within about +/−5% or less when measured across a desired temperature range. In some embodiments, the CTEs of the respective substrates 902 and 904a-b are matched across a temperature range from about −60° C. to about 200° C., or from about 60° C. to about 175° C. In one example embodiment, the matched CTE materials of the first substrate 902 and the substrate(s) 904a-b each includes silicon. For example, the bulk material of the first substrate 902 may include monocrystalline silicon, and the bulk material of the substrate(s) 904a-b may include monocrystalline silicon or polycrystalline silicon. In some embodiments, the method 800 includes forming the dielectric material layer 432 and, optionally, the plurality of metal features 434 (FIG. 4) on the lower surface 920 of the second substrate 904.

At block 804, the method 800 includes directly bonding the plurality of cold plate bodies 901 formed in the second substrate 904 to the plurality of semiconductor devices 304 in the first substrate 902. As described above, the bonding surfaces may each comprise a dielectric material layer 430, 432, and directly bonding the first and second substrates 902, 904 includes forming dielectric bonds between the dielectric material layers 430, 432. Optionally, the first and second substrates 902, 904 may be directly bonded using a hybrid of the dielectric bonds and metal bonds formed between the metal features 434, 436 (FIG. 4).

Generally, directly bonding the surfaces (of the dielectric material layers 430, 432) includes preparing the surfaces, aligning, and contacting the surfaces. Preparing the surfaces for may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the substrates 902, 904 using a chemical mechanical polishing (CMP) process. Activating and terminating the surfaces (of the dielectric material layers 430, 432) with a desired species may include exposing the surfaces to radical species formed in a plasma.

In some embodiments, the plasma is formed using a nitrogen-containing gas, e.g., N2, and the terminating species includes nitrogen and hydrogen. In some embodiments, the surfaces (430, 432) may be activated using a wet cleaning process, e.g., by exposing the surfaces to an aqueous ammonia solution. In some embodiments, the dielectric bonds may be formed using a dielectric material layer deposited on only one of the substrates 902, 904, i.e., the dielectric material layers 430 or 432 may be deposited on the cold plate body 324 or the singulated device 304 but not on both. In those embodiments, the direct dielectric bonds may be formed by contacting the deposited dielectric material layer of one substrate directly with a bulk material surface of the other substrate, e.g., a bulk semiconductor or polysilicon material surface. In such embodiments, the bulk material surface may comprise a thin layer of native oxide or may be cleaned prior to contact so that it is substantially free of native oxide.

Directly forming direct dielectric bonds between the substrates at block 804 includes bringing the prepared and aligned surfaces into direct contact at a temperature less than 150° C., such as less than 100° C., for example, less than 30° C., or about room temperature, e.g., between 20° C. and 30° C. Without intending to be bound by theory, it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C. for a duration of about 5 minutes or more, such as about 15 minutes. Typically, the bonds will strengthen over time even without the application of heat. Thus in some embodiments, the method does not include heating the substrates.

In embodiments where the substrates are bonded using hybrid dielectric and metal bonds, the method may further include planarizing or recessing the metal features 434, 436 below the field surface before contacting and bonding the dielectric material layers 430, 432. After the dielectric bonds are formed, the substrates 902, 904 may be heated to a temperature of 150° C. or more for a period of about 1 hour or more, such as between 8 and 24 hours, to form direct metallurgical bonds between the metal features 434, 436. Suitable direct dielectric and hybrid bonding technologies that may be used to perform aspects of the methods described herein include ZiBond® and DBI®, each of which are commercially available from Adeia Holding Corp., San Jose, CA, USA.

Figure 9A:
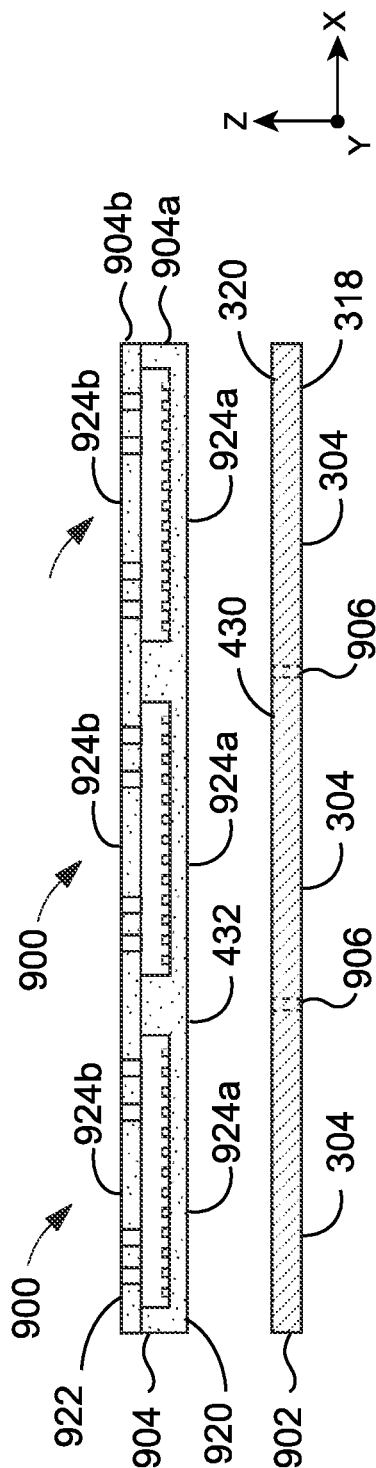
FIGS. 9A-9D and 10A-10B are schematic side views of cooling assemblies at different stages of the method of FIG. 8.
Figure 9B:
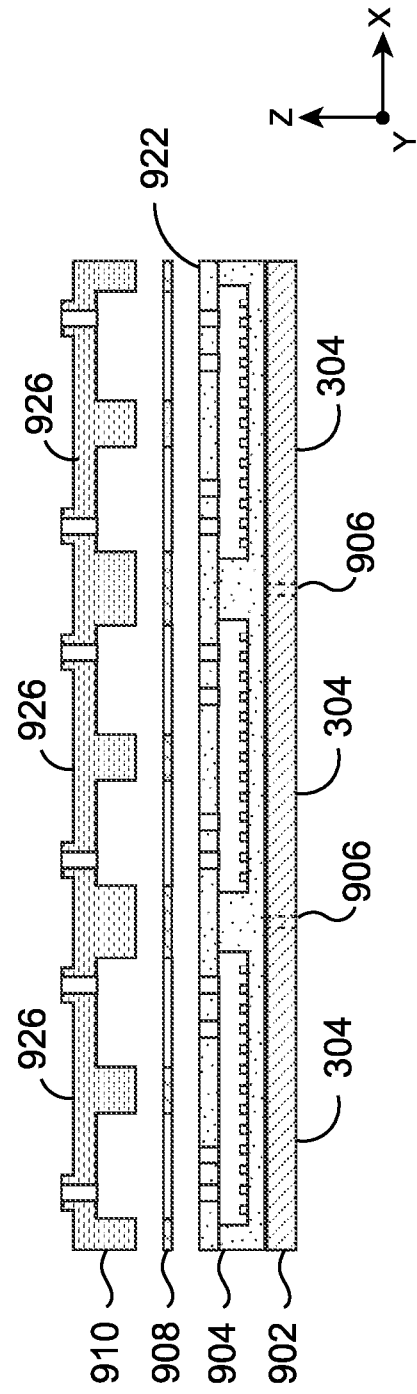
Figure 9C:
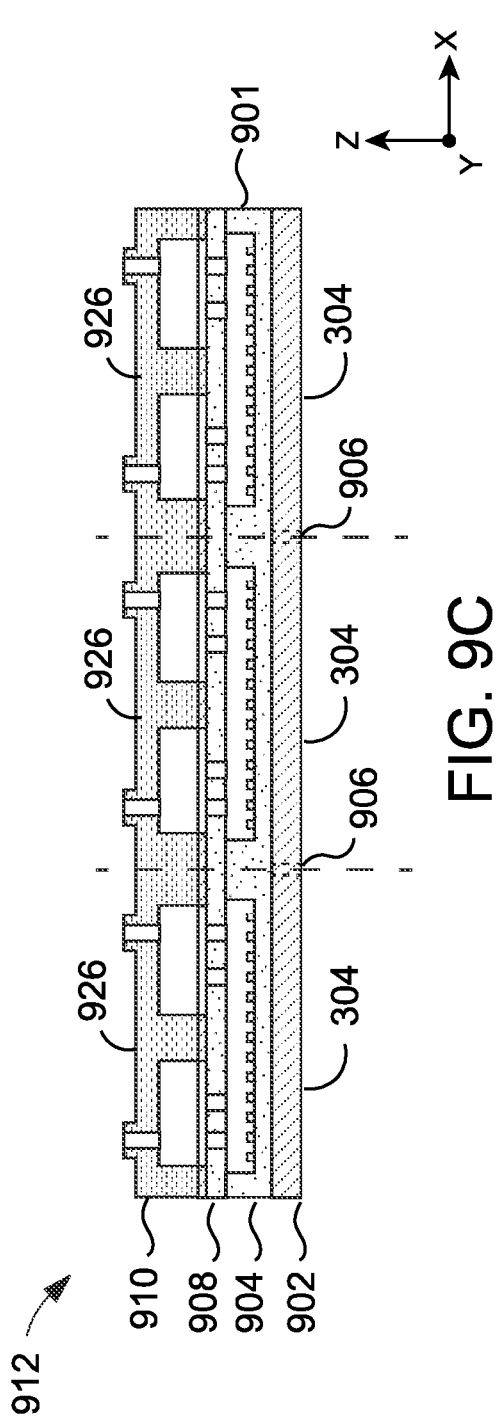

At block 806, the method 800 includes attaching a plurality of manifold lids 926 (FIG. 9B) to an upwardly facing surface 922 of the second substrate 904 to form the bonded substrate stack 912. In some embodiments, and as shown in FIG. 9B, the manifold lids 926 are defined by a repeating pattern formed in a third substrate 910. In those embodiments, the third substrate 910 may comprise a unitary body of one or more relatively ductile materials, such as a metal, polymer, epoxy, or laminate. In those embodiments, attaching the plurality of manifold lids 926 may include aligning the third substrate 910 with the second substrates(s) 904a-b in the Z-direction, and using an adhesive layer 908 to adhere the third substrate 910 to the substrate(s) 904a-b. Here, the adhesive layer 908 may formed of a compliant material in order to absorb relative movements caused by a CTE mismatch between the substrate(s) 904a-b and the third substrate 910. In some embodiments, the third substrate 910 is attached to the second substrate 904 to form a substrate stack 912 comprising a plurality of pre-singulation cooling assemblies 900 (FIG. 9C) before directly bonding the first and second substrates 902, 904.

At activity 808, the method 800 includes singulating the plurality of cooling assemblies 900 (FIG. 9D) and the devices 304 bonded thereto. As shown, each cooling assembly 900 includes a cold plate body 901 and a manifold lid 926 attached to the cold plate body 901, each of which may have any one of, or combination of features of, the cooling assemblies illustrated in FIGS. 4-7.

Figure 9D:
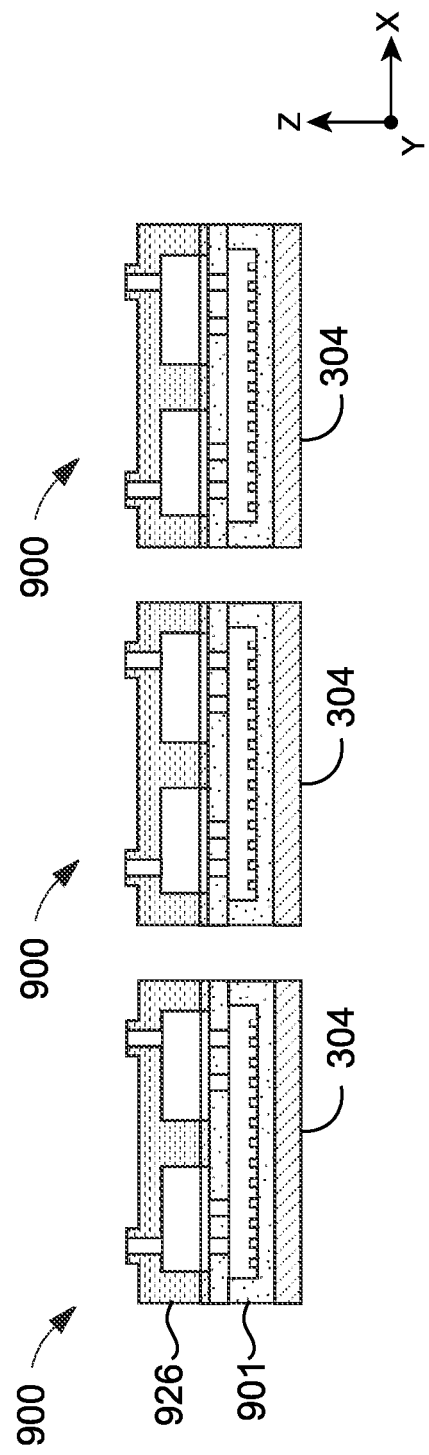

As shown in FIG. 9D, the method 800 imparts distinctive structural characteristics on the cooling assemblies 900 such that the bonding surface of each cooling assembly 900 has the same perimeter as the backside of the respective device 304 bonded thereto. Thus, the sidewalls of the cooling assembly 900 are typically flush with the edges of the device 304 about their common perimeters. In some embodiments, the cooling assemblies 900 are singulated from the second substrate stack 912 using a process that cuts or divides the substrate stack 912 in a vertical plane, i.e., parallel to the Z-direction. In those embodiments, the sides of the cooling assemblies 900 are substantially perpendicular to the backside 320 of the device, i.e., a horizontal (X-Y) plane of an attachment interface between the device 304 and the cooling assembly 900. In some embodiments, the cooling assemblies 900 are singulated using a saw or laser dicing process.

In FIGS. 9A-9D, the substrates 902 and 904 each include a corresponding number of devices 304 and cold plate bodies 901 that are aligned and bonded to one another. However, it should be recognized that in a typical manufacturing process at least some of the devices manufactured on a substrate may be non-functional or may have otherwise failed a quality control criteria prior to the method 800. In such cases, it may be desirable to replace the non-functional devices with singulated replacement devices formed on other substrates prior to bonding at block 804. In such implementations, the replacement devices may be singulated from the other substrates after depositing and polishing a backside dielectric material layer thereon and before or after activating the backside surface. For example, the non-functional devices may be singulated from the substrate 902 and removed from a carrier substrate to create an opening. A replacement device may be mounted to the carrier substrate thereafter but before activating the bonding surfaces 430, 432. Alternatively, the substrates 902, 904 may be bonded, and a replacement device may be separately activated, aligned, and bonded with an open surface of the second substrate 904 thereafter.

Figure 10A:
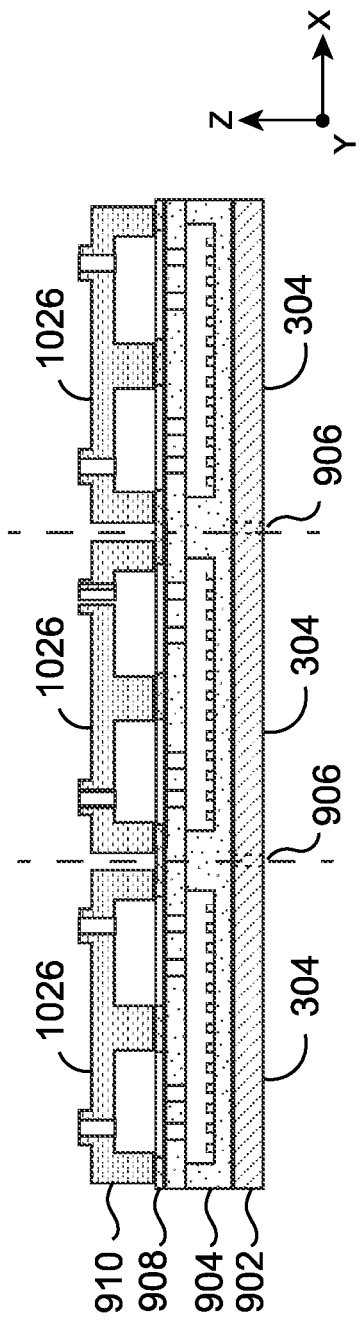
Figure 10B:
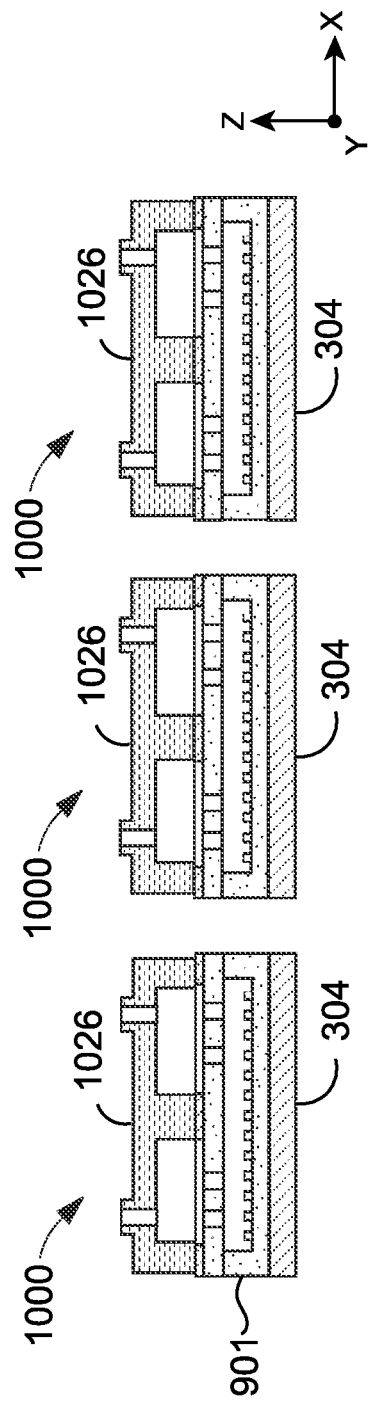

In other embodiments, such as shown in FIGS. 10A-10B, a plurality of separate manifold lids 1026 are individually attached to the surface 922 to form the cooling assemblies 1000. In those embodiments, the cooling assemblies 1000 are directly bonded to the device 304 and the outside sidewalls of the cold plate body 901 are flush with the edges of the device 304. As shown, the sides of the manifold lid 1026 may be recessed from the sidewalls of the cold plate body 901 (in the X and Y directions).

Figure 11:
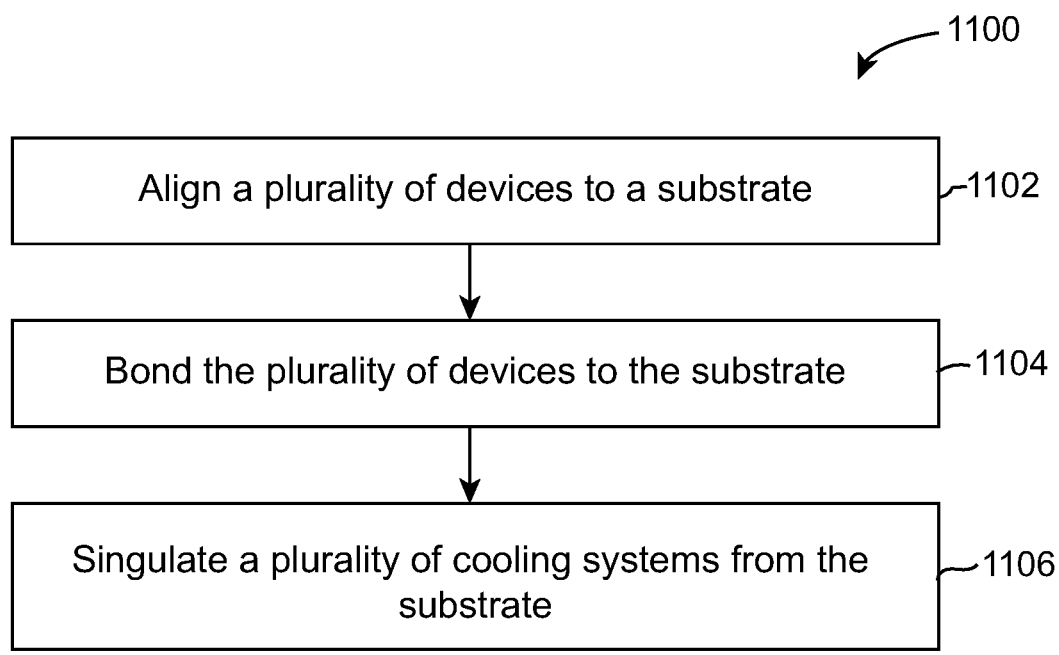
FIG. 11 is a flow diagram of a method of manufacturing cooling assemblies, in accordance with example embodiments of the disclosure.
Figure 12A:
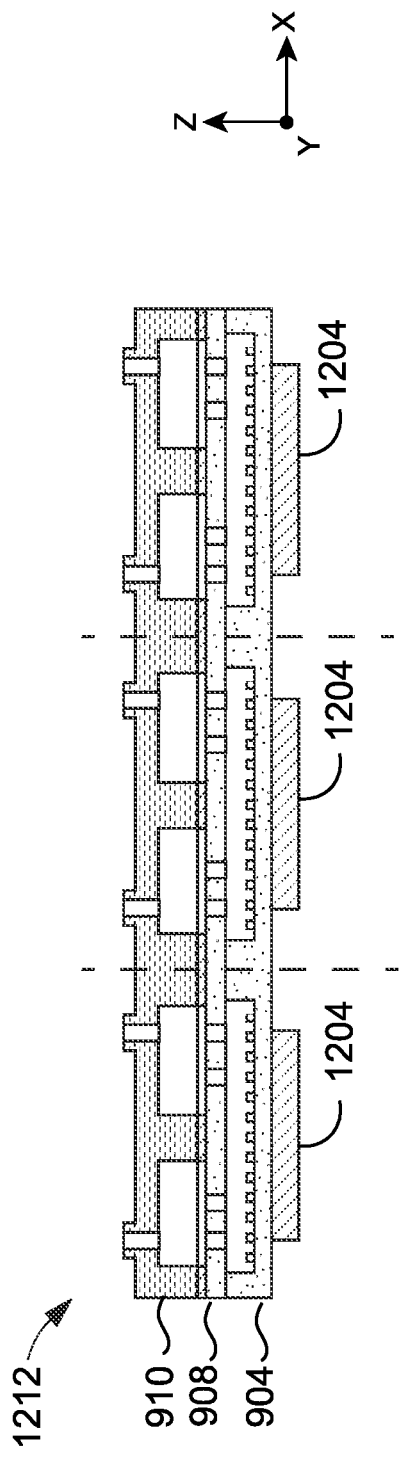
FIGS. 12A-12B and 13A-13B are schematic side views of cooling assemblies at different stages of the method of FIG. 11.
Figure 12B:
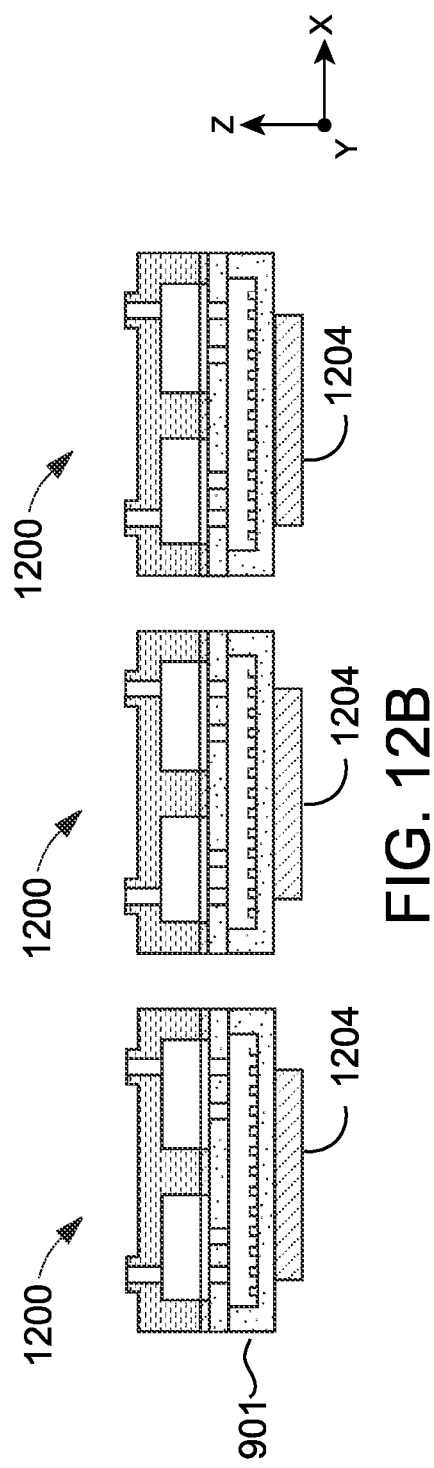

FIG. 11 is a flow diagram of a method 1100 for manufacturing embedded cooling assemblies using a die-to-substrate bonding process, where the individual die are singulated prior to the method. FIGS. 12A-12B and 13A-13B illustrate aspects of the method 1100.

At blocks 1102 and 1104, the method 1100 includes aligning a plurality of singulated devices 1204 with a first substrate stack 904, e.g., by use of a pick and place process, and directly bonding the devices 1204 to the substrate stack, e.g., by use of the direct bonding method described above. Here, the singulated devices 1204 may be bonded to the first substrate stack 904 before or after attachment of the third substrate 910 or separate manifold lids 1026 (shown in FIG. 10A). The singulated devices 1204, the first substrate stack 904, and the third substrate 910 form a second substrate stack 1212.

At block 1106, the method 1100 includes singulating a plurality of cooling assemblies 1200 from the second substrate stack to form a plurality of cooling assemblies 1200, where the perimeter of each device 1204 is recessed from a perimeter of the cold plate body 901 when viewed from the Z-direction.

Figure 13A:
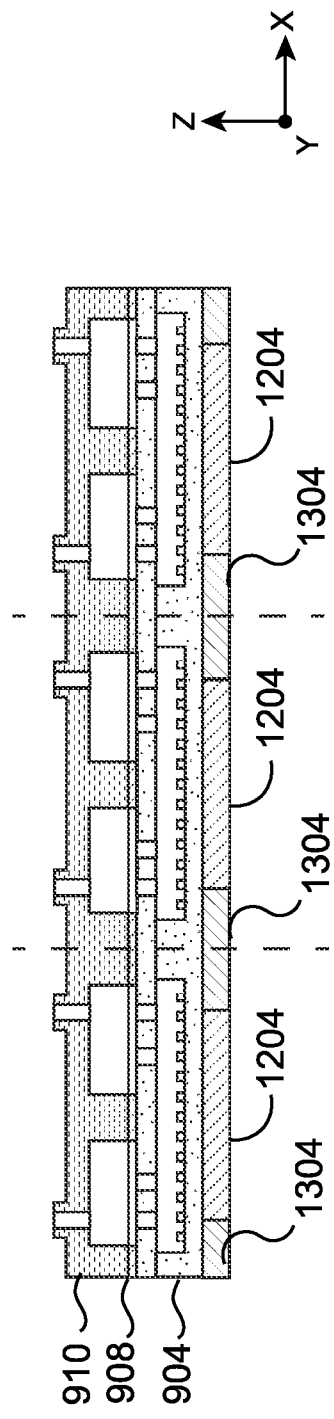
Figure 13B:
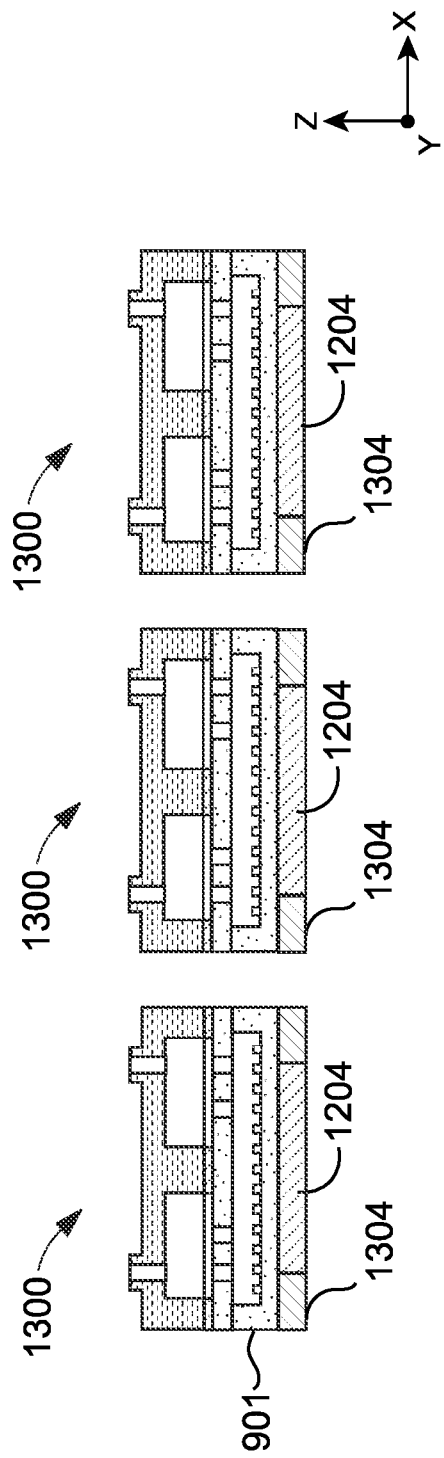

In some embodiments, the method 1100 includes directly bonding a plurality of support features 1304 to the bonding surface 920 of the first substrate stack 904, such as shown in FIGS. 13A) and singulating a plurality of cooling assemblies 1300 (FIG. 13B). The plurality of support features 1304 may be formed of the same material, e.g., silicon, and have the same thickness as the devices 1204. In those embodiments, the support features 1304
may have a perimeter that is substantially coextensive with a perimeter of the cold plate body 901 following singulation at block 1104.

The methods described above advantageously provide for embedded fluid-based cooling assemblies that eliminate and/or substantially reduce the thermal resistance pathway typically associated with cooling systems attached to the exterior of a device package. The cooling assemblies may be attached to a semiconductor device using a direct dielectric or hybrid dielectric and metal bonding method. Such bonding methods allow for relatively low thermal budgets while providing substantially increased bonding strengths when compared to conventional silicon-to-silicon bonding methods, such as thermocompression bonding methods.

The cooling assemblies generally include a cold plate body and a manifold lid attached to the cold plate body, each formed of a different material having different thermal properties. The cold plate body and the semiconductor device are typically formed of CTE matched materials which eliminates the need for an intervening TIM layer. The manifold lid is typically formed of a less brittle material than the cold plate body to allow for less fragile/more robust connections to a cooling fluid delivery source. Typically, the cold plate body and the manifold lid are formed of CTE mismatched materials and attached to one another using a compliant adhesive layer. The adhesive layer absorbs the difference in linear expansion between the manifold lid and the cold plate body during repeated thermal cycles to extend the useful lifetime of the cooling assembly.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the invention. Only the claims that follow are meant to set bounds as to what the present invention includes.

What is claimed is:

1. A cooling assembly attached to a singulated device, the cooling assembly comprising:
 a cold plate body comprising a first side adjacent to the singulated device and an opposite second side; and a manifold lid attached to the second side, wherein:
   the cold plate body and the singulated device each comprise copper features disposed in respective bonding surfaces;
   the cold plate body is attached to the singulated device by direct dielectric-to-dielectric bonds formed between the bonding surface of the first side of the cold plate body and the bonding surface of a backside of the singulated device and by direct metal bonds formed between the copper features;
   the cold plate body and the manifold lid define one or more cavities; and
   the one or more cavities form at least a portion of a fluid flow path from an inlet to an outlet of the manifold lid.

2. The cooling assembly of claim 1, wherein:
sidewall surfaces of the cold plate body and the singulated device are substantially coplanar with each other.

3. The cooling assembly of claim 2, wherein the sidewall surfaces of the cold plate body are substantially perpendicular to the backside of the singulated device.

4. The cooling assembly of claim 1, wherein sidewall surfaces of the manifold lid are substantially coplanar with sidewall surfaces of the cold plate body.

5. A cooling assembly comprising:
a cold plate body comprising a first side adjacent to a singulated device and an opposite second side; and
a manifold lid attached to the second side, wherein:
   the cold plate body comprises a plurality of base plates arranged in a stack;
   the cold plate body is attached to the singulated device by direct dielectric-to-dielectric bonds formed between a bonding surface of the first side of the cold plate body and a bonding surface of a backside of the singulated device;
   the cold plate body and the manifold lid define one or more cavities; and
   the one or more cavities form at least a portion of a fluid flow path from an inlet to an outlet of the manifold lid.

6. The cooling assembly of claim 5, wherein:
the plurality of base plates comprises a lower base plate directly bonded to the singulated device and an upper base plate directly bonded to the lower base plate; and
the fluid flow path sequentially comprises a first cavity disposed between the upper base plate and the manifold lid, a second cavity disposed between the upper base plate and the lower base plate, and a third cavity disposed between the manifold lid and the upper base plate.

7. The cooling assembly of claim 5, wherein:
the plurality of base plates comprises a lower base plate, an upper base plate, and one or more intervening base plates disposed between the lower and upper base plates; and
the fluid flow path sequentially comprises a first cavity disposed between the upper base plate and the manifold lid, a second cavity disposed between the upper base plate and the one or more intervening base plates, and a third cavity disposed between the one or more intervening base plates and the lower base plate.

8. The cooling assembly of claim 1, wherein:
the cold plate body comprises one or more monocrystalline or polycrystalline silicon substrates; and
the manifold lid comprises a metal, a polymer, or an epoxy material.

9. The cooling assembly of claim 1, wherein:
the manifold lid and the cold plate body have different coefficients of thermal expansion; and
the manifold lid is attached to the cold plate body by an adhesive material layer.

10. The cooling assembly of claim 1, wherein at least a portion of the backside of the singulated device is directly exposed to the fluid flow path.

11. A cooling assembly attached to a singulated device, the cooling assembly comprising:
a cold plate body comprising a first side adjacent to the singulated device and an opposite second side; and
a manifold lid attached to the second side, wherein:
   the cold plate body and the singulated device each comprise copper features disposed in respective bonding surfaces;
   the cold plate body is directly bonded to the singulated device by direct dielectric-to-dielectric bonds formed between the bonding surface of the first side of the cold plate body and the bonding surface of the singulated device and by direct metal bonds formed between the copper features;
   the bonding surfaces of the cold plate body and the singulated device are substantially flush with each other; and
   the cold plate body and the manifold lid define one or more cavities that form at least a portion of a fluid flow path from an inlet to an outlet of the manifold lid.

12. The cooling assembly of claim 11, wherein:
sidewall surfaces of the cold plate body and the singulated device are substantially coplanar with each other.

13. The cooling assembly of claim 12, wherein the sidewall surfaces of the cold plate body are substantially perpendicular to the backside of the singulated device.

14. The cooling assembly of claim 11, wherein sidewall surfaces of the manifold lid are substantially coplanar with sidewall surfaces of the cold plate body.

15. The cooling assembly of claim 11, wherein the cold plate body comprises a plurality of base plates arranged in a stack.

16. The cooling assembly of claim 15, wherein:
the plurality of base plates comprises a lower base plate directly bonded to the singulated device and an upper base plate directly bonded to the lower base plate; and
the fluid flow path sequentially comprises a first cavity disposed between the upper base plate and the manifold lid, a second cavity disposed between the upper base plate and the lower base plate, and a third cavity disposed between the manifold lid and the upper base plate.

17. The cooling assembly of claim 15, wherein:
the plurality of base plates comprises a lower base plate, an upper base plate, and one or more intervening base plates disposed between the lower and upper base plates; and
the fluid flow path sequentially comprises a first cavity disposed between the upper base plate and the manifold lid, a second cavity disposed between the upper base plate and the one or more intervening base plates, and a third cavity disposed between the one or more intervening base plates and the lower base plate.

18. The cooling assembly of claim 11, wherein:
the cold plate body comprises one or more monocrystalline or polycrystalline silicon substrates; and
the manifold lid comprises a metal, a polymer, or an epoxy material.

19. The cooling assembly of claim 11, wherein:
the manifold lid and the cold plate body have different coefficients of thermal expansion; and
the manifold lid is attached to the cold plate body by an adhesive material layer.

20. The cooling assembly of claim 11, wherein at least a portion of a backside of the singulated device is directly exposed to the fluid flow path.

21. The cooling assembly of claim 1, wherein the cold plate comprises sloped sidewalls formed by a wet etch.

22. The cooling assembly of claim 1, wherein the cold plate comprises substantially vertical sidewalls formed by a dry etch.

23. The cooling assembly of claim 11, wherein the cold plate comprises sloped sidewalls formed by a wet etch.

24. The cooling assembly of claim 11, wherein the cold plate comprises substantially vertical sidewalls formed by a dry etch.

25. The cooling assembly of claim 1, wherein a first cavity of the one or more cavities forms a first portion of the fluid flow path, the cooling assembly further comprising:
a plurality of features protruding into the first cavity, wherein the plurality of features defines a plurality of channels in the first portion of the fluid flow path.

26. The cooling assembly of claim 11, wherein a first cavity of the one or more cavities forms a first portion of the fluid flow path, the cooling assembly further comprising:
a plurality of features protruding into the first cavity, wherein the plurality of features defines a plurality of channels in the first portion of the fluid flow path.

27. The cooling assembly of claim 6, wherein the fluid flow path comprises a third cavity, different from the first cavity, disposed between the manifold lid and the upper base plate.

28. The cooling assembly of claim 7, wherein the fluid flow path comprises a fourth cavity, different from the first cavity, disposed between the upper base plate and the manifold lid.

29. The cooling assembly of claim 16, wherein the fluid flow path comprises a third cavity, different from the first cavity, disposed between the manifold lid and the upper base plate.

30. The cooling assembly of claim 17, wherein the fluid flow path comprises a fourth cavity, different from the first cavity, disposed between the upper base plate and the manifold lid.

* * * * *